(12) United States Patent
Patra

(10) Patent No.: US 10,871,717 B2
(45) Date of Patent: Dec. 22, 2020

(54) OPTICAL SYSTEM FOR A PROJECTION EXPOSURE APPARATUS

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/731,265

(22) Filed: Dec. 31, 2019

(65) Prior Publication Data

US 2020/0218164 A1 Jul. 9, 2020

(30) Foreign Application Priority Data

Jan. 9, 2019 (DE) .......................... 10 2019 200 193

(51) Int. Cl.
*G03F 7/20* (2006.01)
*G02B 5/08* (2006.01)
(Continued)

(52) U.S. Cl.
CPC .......... *G03F 7/70566* (2013.01); *G02B 5/08* (2013.01); *G02B 5/3066* (2013.01);
(Continued)

(58) Field of Classification Search
CPC .. G03F 7/70566; G03F 7/70091; G03F 7/702; G03F 7/70191; G02B 5/3066
See application file for complete search history.

(56) References Cited

U.S. PATENT DOCUMENTS 6,404,550 B1 * 6/2002 Yajima ................. G02B 27/283
348/E5.141
9,001,279 B2 * 4/2015 Kobayashi .......... G02B 27/283
349/8
(Continued)

FOREIGN PATENT DOCUMENTS

DE 102012206153 A1 10/2013
DE 102013202645 A1 2/2014
(Continued)

OTHER PUBLICATIONS

German Office Action, with translation thereto, for corresponding Appl No. DE 102019200193.9, dated Aug. 13, 2016.
(Continued)

*Primary Examiner* — Steven Whitesell Gordon
(74) *Attorney, Agent, or Firm* — Fish & Richardson P.C.

(57) ABSTRACT

An optical system for a microlithographic projection exposure apparatus for operation in the EUV includes a polarization-influencing arrangement having first and one second double reflection surface units, each having first and second reflection surfaces, in each case arranged directly adjacent at a distance d1 and at an angle of 0°±10° relative to one another. The first reflection surface of the first double reflection surface unit and the second reflection surface of the second double reflection surface unit are arranged directly adjacent at a distance d2 and at an angle of 0°±10° relative to one another, with d2>5*d1. Light incident on the first reflection surfaces forms an angle of 43°±10° with the first reflection surfaces. Light incident on the first reflection surface of the first double reflection surface unit is reflected toward the second reflection surface of the second double reflection surface unit.

20 Claims, 14 Drawing Sheets

(51) Int. Cl.
*G02B 5/30* (2006.01)
*G02B 26/08* (2006.01)

(52) U.S. Cl.
CPC ......... *G02B 26/0816* (2013.01); *G03F 7/702* (2013.01); *G03F 7/70091* (2013.01); *G03F 7/70191* (2013.01)

(56) References Cited

U.S. PATENT DOCUMENTS

| | | | |
|---|---|---|---|
| 9,304,405 B2 | 4/2016 | Fiolka et al. | |
| 9,507,269 B2 | 11/2016 | Hennerkes et al. | |
| 9,766,553 B2 | 9/2017 | Maul | |
| 9,964,856 B2 | 8/2018 | Maul | |
| 2008/0278690 A1* | 11/2008 | Maeda | G02B 27/285 353/20 |
| 2011/0001947 A1 | 1/2011 | Dinger et al. | |
| 2014/0132942 A1* | 5/2014 | Saenger | G03F 7/70116 355/71 |
| 2015/0085272 A1 | 3/2015 | Saenger et al. | |
| 2015/0173163 A1* | 6/2015 | Saenger | G21K 1/16 355/67 |
| 2015/0253677 A1 | 9/2015 | Maul | |
| 2016/0282221 A1 | 9/2016 | Huebel et al. | |

FOREIGN PATENT DOCUMENTS

| | | |
|---|---|---|
| DE | 102012223233 A1 | 6/2014 |
| DE | 102013225498 A1 | 6/2015 |
| WO | WO2012/130768 A2 | 10/2012 |

OTHER PUBLICATIONS

European Search Report directed to European Patent Application EP19210802.512, dated Jun. 12, 2020.

* cited by examiner

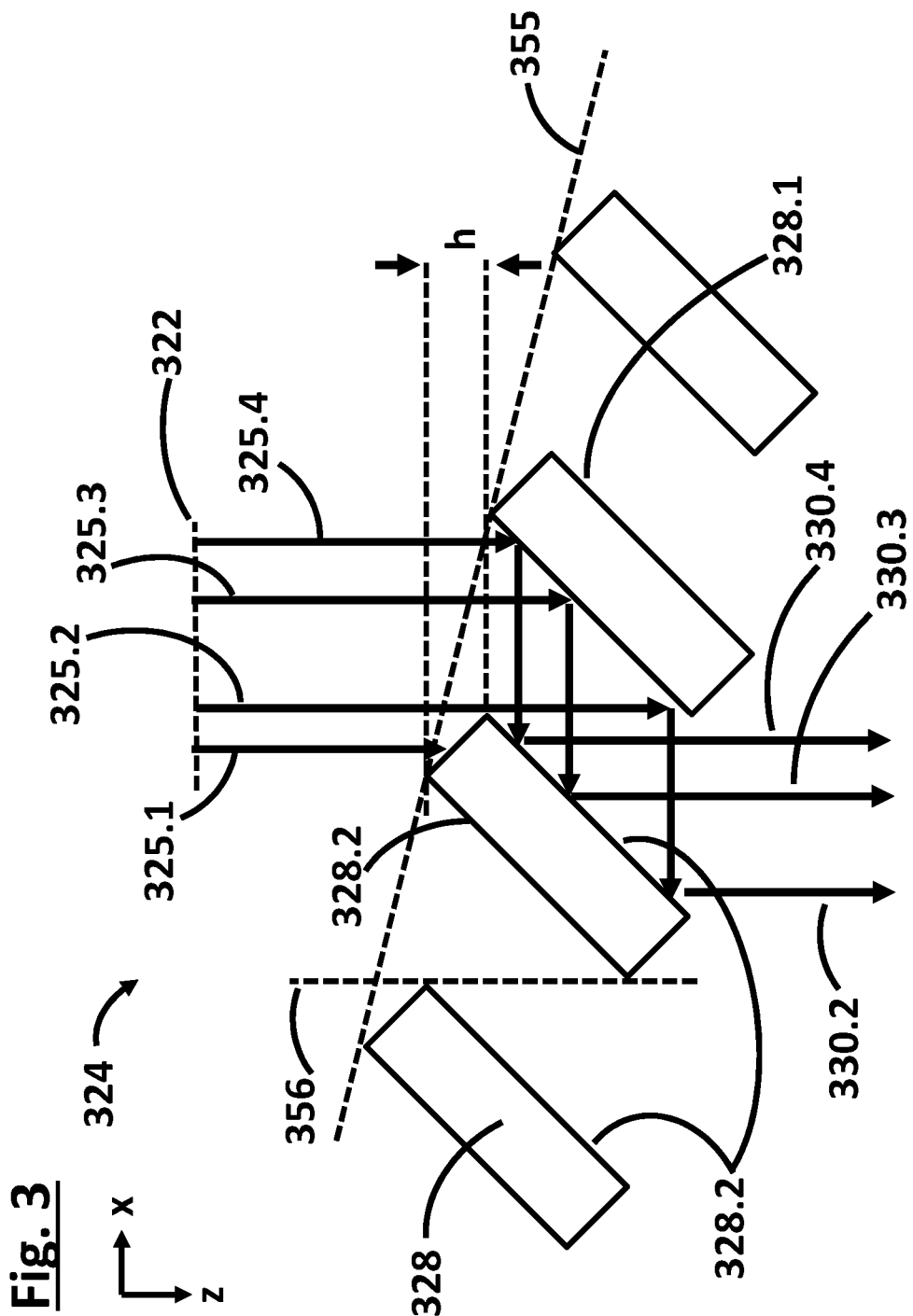

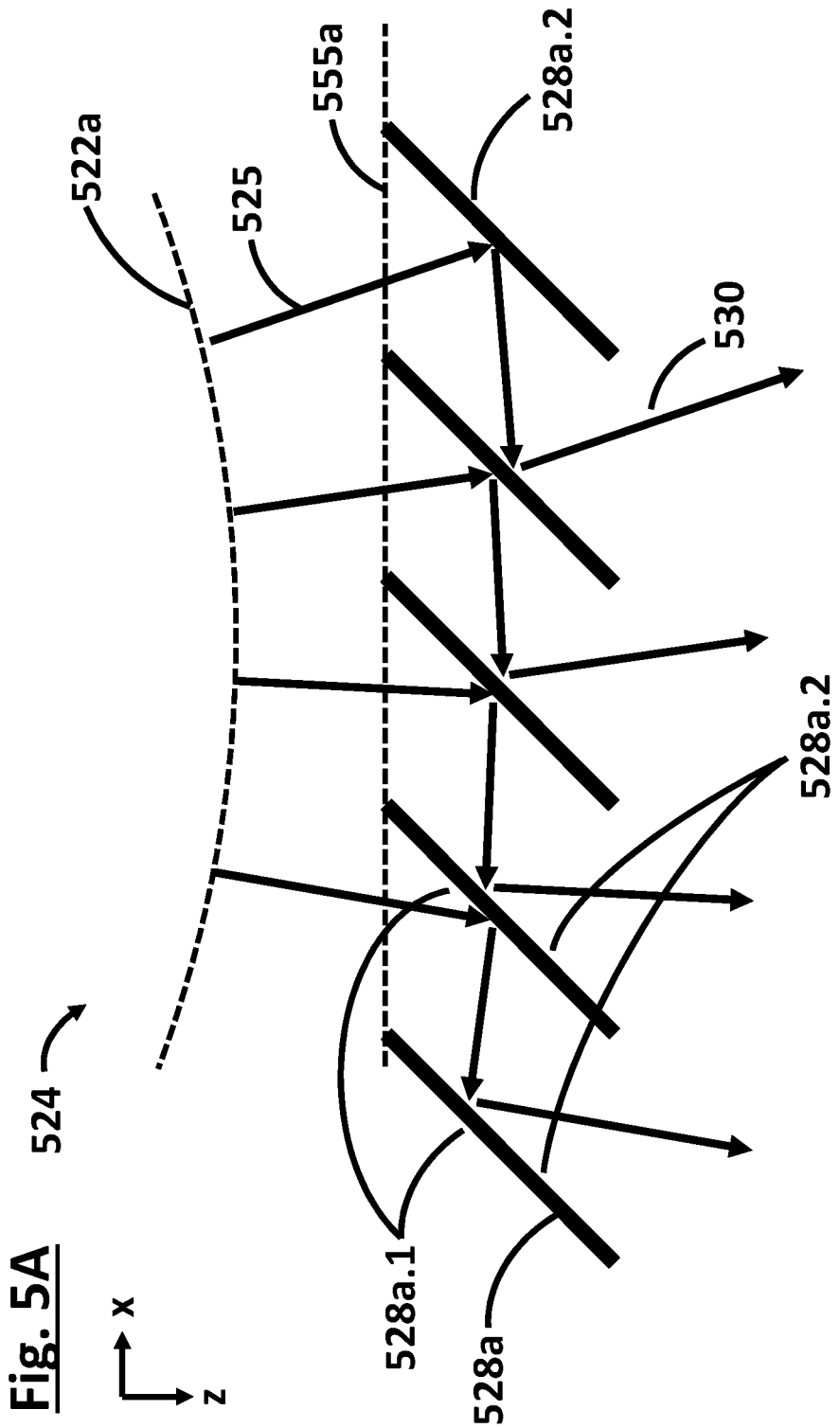

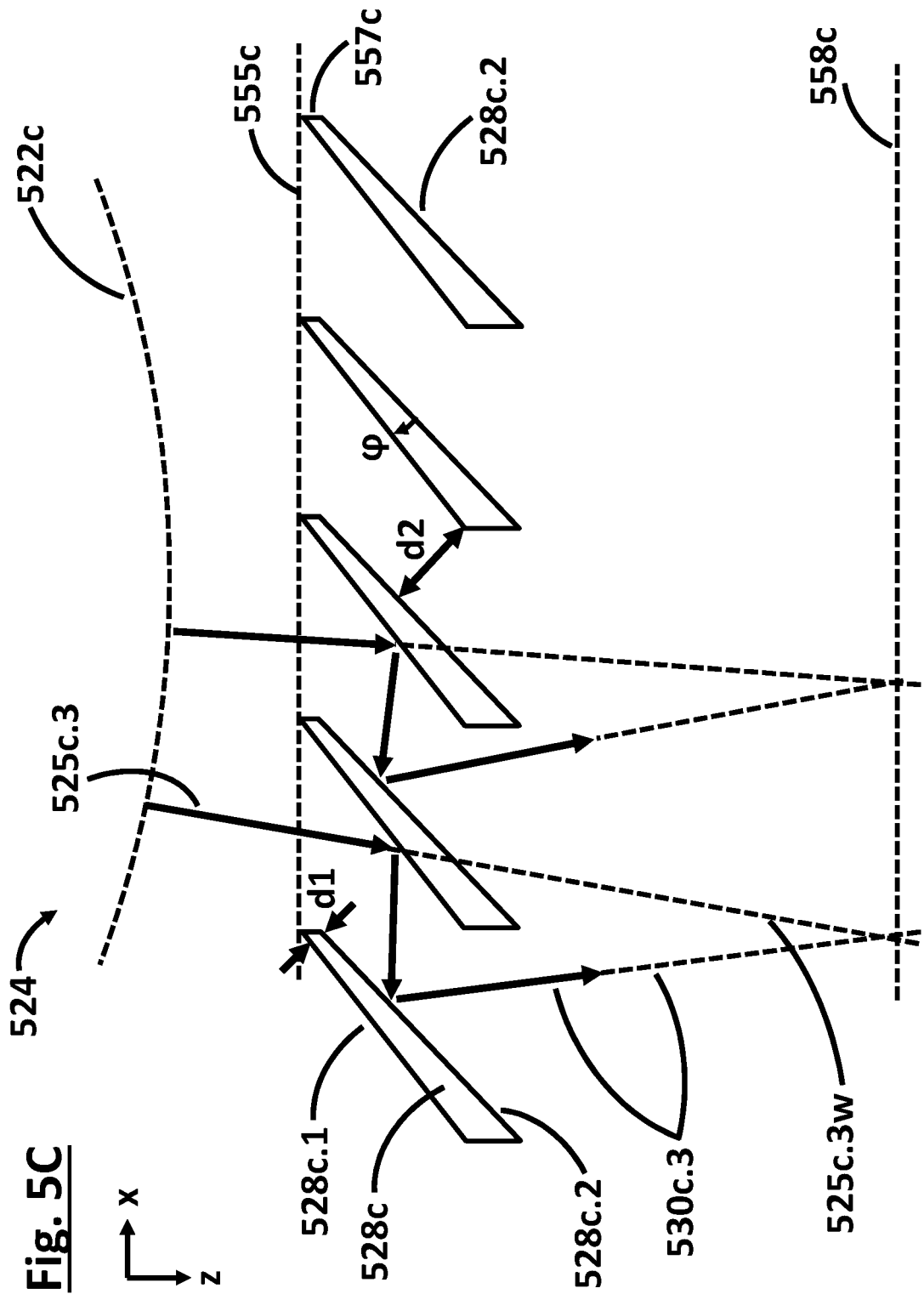

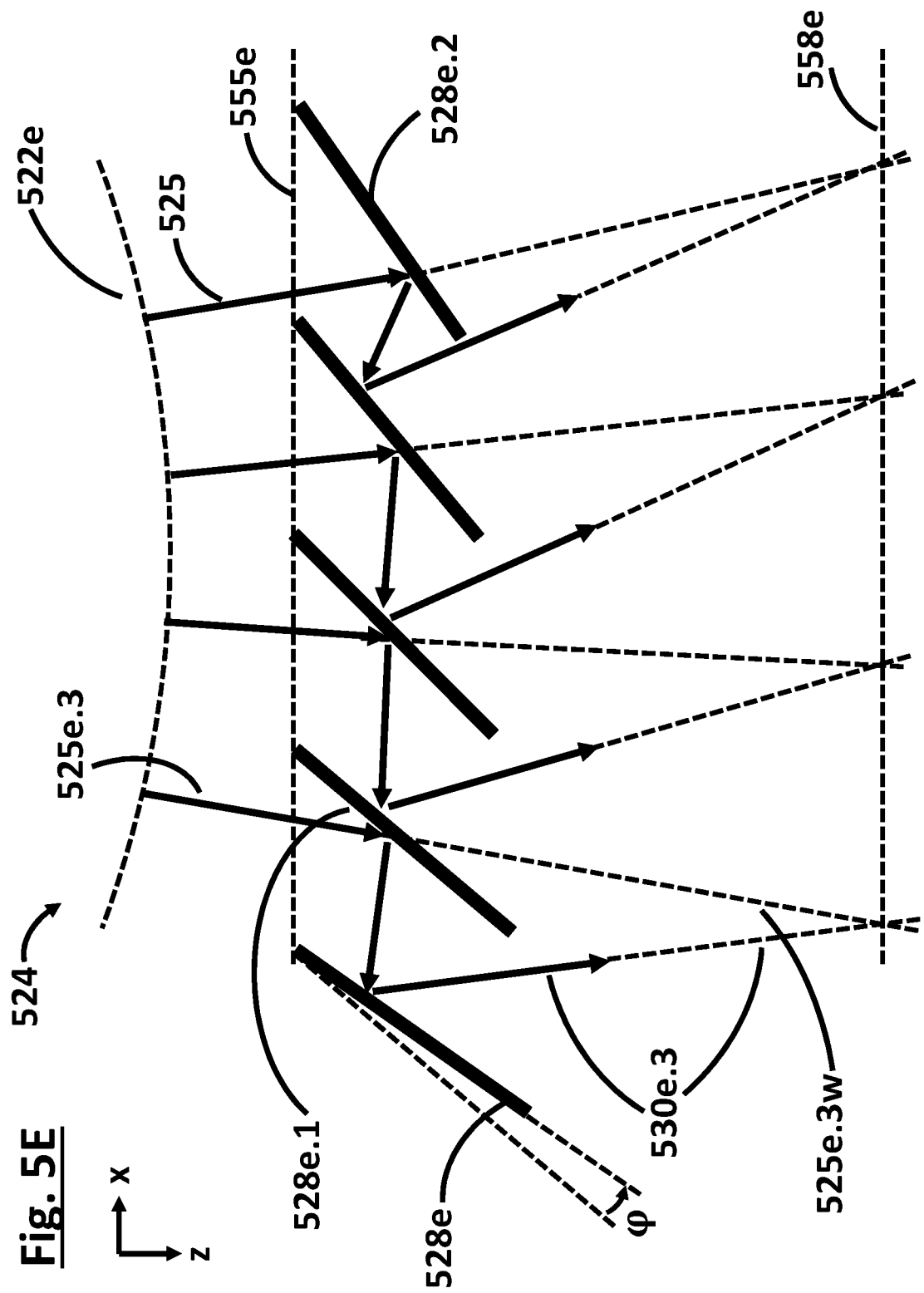

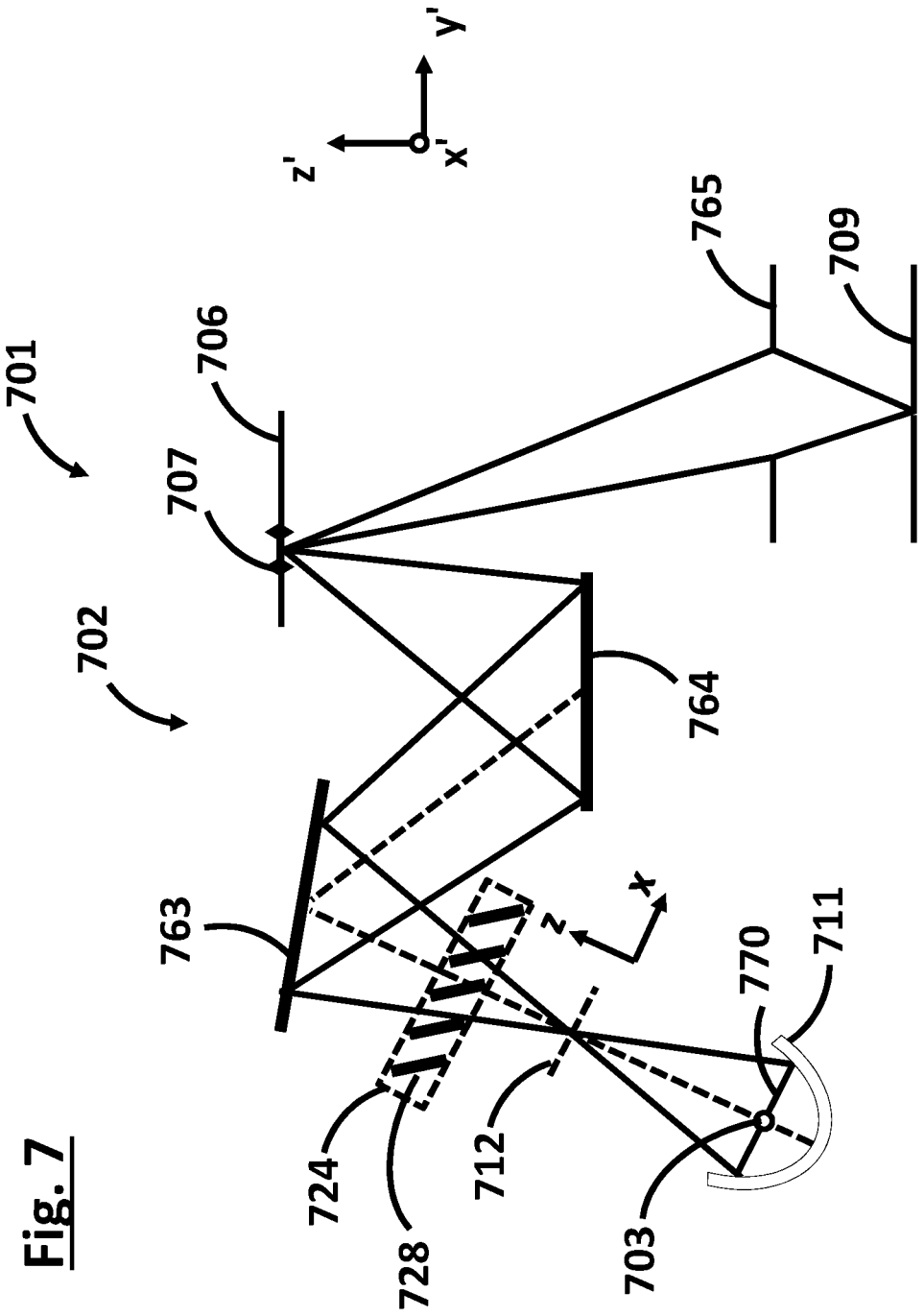

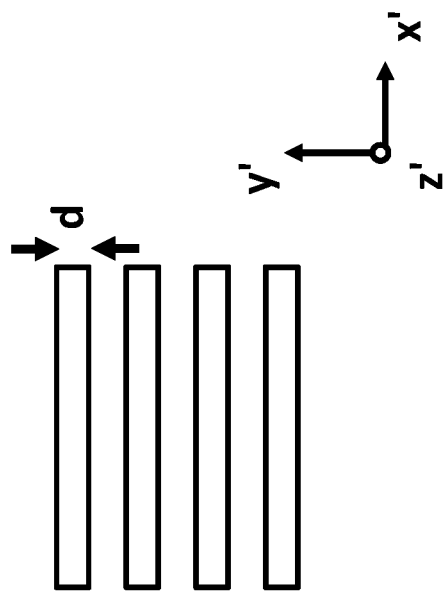
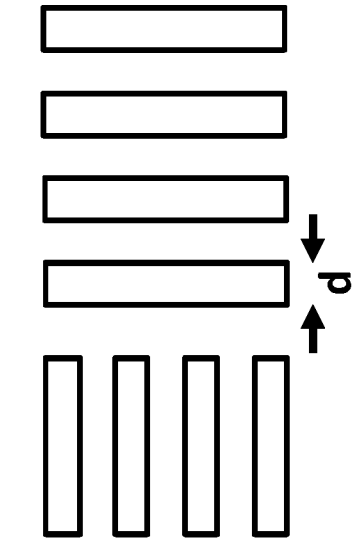
Fig. 8A
Fig. 8B

OPTICAL SYSTEM FOR A PROJECTION EXPOSURE APPARATUS

CROSS-REFERENCE TO RELATED APPLICATION

This application claims priority under 35 U.S.C. § 119 to German application serial number 102019200193.9, filed Jan. 9, 2019, the entire contents of which are incorporated by reference herein.

FIELD

The disclosure relates to an optical system including a polarization-influencing arrangement, in particular for use in a projection exposure apparatus for EUV microlithography.

BACKGROUND

Optical systems including a polarization-influencing arrangement for use in a projection exposure apparatus for EUV microlithography are known for example from DE 102012206153 A1. In particular, it is known from DE 102012206153 A1 to use a polarization-influencing arrangement to polarize incident, unpolarized light via two reflections at the Brewster angle. In this case, the light is linearly polarized by an arrangement of two individual mirrors arranged parallel next to one another, which deflect the incident unpolarized light successively in each case by 90°. The original beam direction of the incident light is maintained here due to the double, oppositely directed beam deflections by 90° in each case. In accordance with DE 102012206153 A1, a plurality of such mirror pairs are arranged next to one another. Moreover, the mirror pairs can be embodied such that they are in each case individually rotatable in order to be able to set the polarization direction of the reflected light.

SUMMARY

The present disclosure seeks to develop an optical system including a polarization-influencing arrangement such that the following properties are enhanced (e.g., optimized):

1.) undesired shadings by the polarization-influencing arrangement are intended to be reduced or minimized; and/or
2.) the mechanical and thermal stability is intended to be improved; in particular, a simpler mechanical mounting of the optical units of the polarization-influencing arrangement is intended to be made possible; and/or
3.) the intention is to enable—besides polarized operation—also unpolarized operation both with an unchanged light distribution in the optical system and with a higher "effective transmission"—compared with polarized operation; "effective transmission" is understood here to mean the quotient of the intensity behind, that is to say downstream of, the arrangement region of the polarization-influencing arrangement with respect to the intensity in front, that is to say upstream, of the arrangement region of the polarization-influencing arrangement; and/or
4.) the producibility of the polarization-influencing arrangement is intended to be simplified and/or production with expenditure of lower costs is intended to be made possible; and/or
5.) the beam offset as a result of the polarization-influencing arrangement is intended to be minimized; and/or
6.) undesired shadings as a result of the polarization-influencing arrangement are intended to be reduced or minimized in conjunction with minimization of the beam offset as a result of the polarization-influencing arrangement; and/or
7.) the polarization-influencing arrangement is intended to be suitable for setting the polarization of incident parallel or divergent light without introducing a beam offset as a result of the polarization-influencing arrangement; and/or
8.) the polarization-influencing arrangement is intended to be retrofittable in existing projection exposure apparatuses, without the need for fundamental changes to the existing projection exposure apparatuses.

According to the disclosure, an optical system for a microlithographic projection exposure apparatus for operation in the EUV, includes at least one polarization-influencing arrangement having at least one first and one second double reflection surface unit. The at least two double reflection surface units each have a first reflection surface and a second reflection surface. Within the same double reflection surface unit, in each case the first reflection surface and the second reflection surface are arranged directly adjacent at a distance $d1$ and at an angle of $0°\pm10°$ relative to one another. The first reflection surface of the first double reflection surface unit and the second reflection surface of the second double reflection surface unit are arranged directly adjacent at a distance $d2$ and at an angle of $0°\pm10°$ relative to one another. During operation of the optical system, light incident on the first reflection surfaces forms an angle of $43°\pm10°$ with the first reflection surfaces. During operation of the optical system, light incident on the first reflection surface of the first double reflection surface unit is reflected toward the second reflection surface of the second double reflection surface unit. The following holds true: $d2 > 5*d1$.

According to the disclosure, it has been recognized that a targeted choice of the distances between the reflection surfaces of the abovementioned polarization-influencing arrangement can be used for reducing the shading regions.

According to the disclosure, an optical system for a microlithographic projection exposure apparatus for operation in the EUV, wherein the optical system includes at least one polarization-influencing arrangement having at least one first and one second double reflection surface unit. The at least two double reflection surface units each have a first reflection surface and a second reflection surface. Within the same double reflection surface unit, in each case the first reflection surface and the second reflection surface are arranged directly adjacent at a distance $d1$ and at an angle of $0°\pm10°$ relative to one another. "Directly adjacent" means here that no further optically used reflection surface of the polarization-influencing arrangement is situated between the two reflection surfaces arranged directly adjacent at a distance $d1$. The first reflection surface of the first double reflection surface unit and the second reflection surface of the second double reflection surface unit are arranged directly adjacent at a distance $d2$ and at an angle of $0°\pm10°$ relative to one another. During operation of the optical system, light incident on the first reflection surfaces forms an angle of $43°\pm10°$, in particular $43°\pm5°$, with the first reflection surfaces. During operation of the optical system, light incident on the first reflection surface of the first double reflection surface unit is reflected toward the second reflection surface of the second double reflection surface unit. For the distances d1 and d2 it holds true for example that d2>5*d1. In particular, it can be that d2>10*d1, in particular d2>20*d1.

As a result of such small distances d1, undesired shadings in the beam path downstream of the polarization-influencing arrangement are reduced. If the polarization-influencing arrangement is removed from the beam path in order to enable unpolarized operation, the light distribution in the optical system remains almost unchanged since the undesired shadings as a result of the polarization-influencing arrangement are reduced. Moreover, removing the polarization-influencing arrangement enables unpolarized operation with a higher "transmission" since the reflection surfaces of the polarization-influencing arrangement are removed from the beam path without the light distribution being changed in the process. Moreover, the producibility of the polarization-influencing arrangement is simplified since the two reflection surfaces, which are only at a distance d1, can be applied on a single optical element—on the front and rear sides. Production with expenditure of lower costs can be achieved as a result. The "effective transmission" during polarized operation is increased due to the fact that the shadings induced by the polarization-influencing arrangement are reduced.

In accordance with a further embodiment, the optical system includes (e.g., consists of) at least ten double reflection surface units. For a given total size of the optical system, each double reflection surface unit thus tends to be small. Undesired shading and beam deflection effects scale with the size of the individual double reflection surface unit and can therefore be reduced by the use of a large number of double reflection surface units.

In accordance with one embodiment and/or in accordance with an alternative definition, the optical system for a microlithographic projection exposure apparatus for operation in the EUV includes at least one polarization-influencing arrangement having at least two first reflection surfaces and at least two second reflection surfaces. The first and second reflection surfaces are in each case arranged at an angle of 0°±10° relative to one another. During operation of the optical system, light incident on the first reflection surfaces forms in each case an angle of 43°±10°, in particular 43°±5°, with the first reflection surfaces. The first reflection surfaces and the second reflection surfaces are arranged alternately and at alternate distances d1 and d2. For the distances d1 and d2 it holds true that: d2>5*d1. In particular, it can be that d2>10*d1, in particular d2>20*d1.

In accordance with one embodiment and/or in accordance with an alternative definition, the optical system for a microlithographic projection exposure apparatus for operation in the EUV includes at least one polarization-influencing arrangement having at least one first reflection surface and at least two second reflection surfaces. The first reflection surface and the two second reflection surfaces are in each case arranged at an angle of 0°±10° relative to one another. During operation of the optical system, light incident on the first reflection surface forms an angle of 43°±10°, in particular 43°±5°, with the first reflection surface. The first reflection surface is arranged between the two second reflection surfaces. The first reflection surface is arranged at a distance d1 from one of the second reflection surfaces and at a distance d2 from the other second reflection surface. For the distances d1 and d2 it holds true that: d2>5*d1. In particular, it can be that d2>10*d1, in particular d2>20*d1.

In accordance with one embodiment, the polarization-influencing arrangement is rotatable about a rotation axis extending parallel to a light propagation direction of light incident on the first reflection surface during operation of the optical system, and/or the polarization-influencing arrangement is configured such that it is removable from the beam path of the light incident on the first reflection surface during operation of the optical system. Light propagation direction is understood here to mean the direction of the principal ray. As a result of the rotatability of the polarization-influencing arrangement, the polarization direction can be varied continuously depending on the rotation angle. Removing the polarization-influencing arrangement makes it possible to switch between polarized operation (polarization-influencing arrangement in the beam path) and unpolarized operation (polarization-influencing arrangement removed from the beam path). "Beam path" is understood here to mean the region in which the used EUV light is guided from the radiation source toward the reticle; and not for instance regions in which only parasitic light such as, for example, stray light and/or only light having a wavelength not equal to the used EUV light wavelength can pass. Due to the fact that only the entire polarization-influencing arrangement is rotatable and/or removable (rather than for instance each of the double reflection surface units being inherently rotatable), the mechanical and thermal stability is improved since only one (larger) rotating device is implemented and a more stable mechanical mounting can thus be used, which moreover enables better and more easily implementable heat dissipation. Moreover, a larger rotating device is producible more simply and more cost-effectively.

In accordance with one embodiment, the first reflection surface and the second reflection surface of at least one of the double reflection surface units are arranged at two side surfaces of a monolithic element. As a result, the producibility of the polarization-influencing arrangement is simplified since, instead of two separate elements, the two reflection surfaces are applied on a single optical element—namely on the front and rear sides. As a result, production with expenditure of lower costs is achieved since one element per double reflection surface unit can be saved.

In accordance with one embodiment, at least one side surface of the monolithic element is arranged parallel to a light propagation direction of light incident on the first reflection surface during operation of the optical system.

As a result, the undesired shadings can be additionally reduced. Moreover, what can be achieved as a result is that the light distribution in the optical system changes as little as possible if the polarization-influencing arrangement is removed from the beam path or is introduced into the beam path. The "effective transmission" during polarized operation is increased due to the fact that the shadings as a result of the polarization-influencing arrangement are reduced.

In accordance with one embodiment, the first reflection surface and the second reflection surface of a double reflection surface unit are arranged on different elements. Due to the small distance d1, the shadings are reduced in the case of this embodiment as well. Moreover, the two different elements can be arranged relative to one another in such a way that a preferred arrangement of the first and second reflection surfaces—for example an exactly parallel arrangement or alternatively an arrangement inclined in a targeted manner relative to one another—is made possible. An arrangement of the first and second reflection surfaces inclined relative to one another by a correction angle can be used in particular for correcting the beam offset caused by the polarization-influencing arrangement. Moreover, an arrangement of the first and second reflection surfaces inclined relative to one another can be configured in such a way that the polarization-influencing arrangement is designed or optimized in a targeted manner for divergently incident light. The same effect can also be achieved by a monolithic embodiment having a wedge-shaped geometry.

In accordance with one embodiment, the first reflection surfaces and the second reflection surfaces include
   an EUV reflection layer and/or
   a polarization-influencing layer and/or
   a molybdenum-silicon multilayer coating and/or
   a ruthenium coating and/or
   a molybdenum-silicon multilayer coating with a ruthenium cover layer. As a result, the "effective transmission" can be increased and/or the polarization-splitting effect of the reflection surfaces can be improved.

In accordance with one embodiment, a second reflection surface is arranged in a manner displaced by a height h relative to a directly adjacent first reflection surface in the light propagation direction (z) of light incident on the first reflection surface during operation of the optical system.

As a result, the undesired shadings can be additionally reduced. Moreover, what can be achieved as a result is that the light distribution in the optical system changes as little as possible if the polarization-influencing arrangement is removed from the beam path or is introduced into the beam path. The "effective transmission" is increased due to the fact that the shadings are reduced.

In accordance with one embodiment, h>d1. In particular, h deviates by at most 20% from h'=d1*√2.

As a result, the undesired shadings can be additionally reduced. Moreover, what can be achieved as a result is that the light distribution in the optical system changes as little as possible if the polarization-influencing arrangement is removed from the beam path or is introduced into the beam path. The "effective transmission" is increased by virtue of the fact that the shadings are reduced. From a geometric standpoint h=d1*√2 may be a preferred embodiment in which the shadings in the theoretical ideal case (i.e. without tolerances, parallel incident light, etc.) completely disappear.

In accordance with one embodiment, at least one of the reflection surfaces has an extent L in a first direction of extent. The first direction of extent is given by the projection of a light propagation direction of light incident on the first reflection surface during operation of the optical system into a plane in which the first reflection surface is arranged. L deviates by at most 20% from L'=2*d2. As a result, the undesired shadings can be additionally reduced. Moreover, what can be achieved as a result is that the light distribution in the optical system changes as little as possible if the polarization-influencing arrangement is removed from the beam path or is introduced into the beam path. The "effective transmission" is increased by virtue of the fact that the shadings are reduced. From a geometric standpoint L=2*d2 may be a preferred embodiment in which the shadings in the theoretical ideal case (i.e. without tolerances, parallel incident light, etc.) completely disappear.

In accordance with one embodiment, via the polarization-influencing arrangement, unpolarized or circularly polarized light incident on the first reflection surface during operation of the optical system can be converted into linearly polarized light reflected from the second reflection surface.

In accordance with one embodiment, an illumination system for a microlithographic projection exposure apparatus designed for operation in the EUV includes an optical system having the features disclosed above.

In accordance with one embodiment, the illumination system has an intermediate focal plane and at least one first facet mirror having a plurality of facets. The at least one polarization-influencing arrangement is arranged in the beam path between the intermediate focal plane and the first facet mirror for influencing the polarization state of the light. The following advantages result from such an arrangement of the polarization-influencing arrangement:

1.) Via the polarization-influencing arrangement, de facto more than 50% of the power of the incident light is removed from the beam path (namely approximately 50% as a result of the filtered-out "incorrect" polarization direction and also additional reflection losses as a result of the double reflection). If the polarization-influencing arrangement is arranged so early in the system, the radiation loading on all downstream elements is greatly reduced, which advantageously influences effects such as the lifetime and thermal aspects; and 2.) Possible shadings downstream of the polarization-influencing arrangement are "washed out" as a result of the downstream light mixing, which has a favorable influence on the uniformity of the field illumination of the reticle.

In accordance with one embodiment, a microlithographic projection exposure apparatus includes an illumination system described above and a projection optical unit.

In accordance with one embodiment, a method for microlithographically producing microstructured components includes the following steps:
   providing a substrate, to which a layer composed of a light-sensitive material is at least partly applied;
   providing a mask including structures to be imaged;
   providing a microlithographic projection exposure apparatus described above; and
   projecting at least one part of the mask onto a region of the layer with the aid of the projection exposure apparatus.

BRIEF DESCRIPTION OF THE DRAWINGS

The disclosure is explained in greater detail below on the basis of exemplary embodiments that are illustrated in the accompanying drawings, in which:
FIG. 3 shows a schematic illustration of a section through one embodiment of a polarization-influencing arrangement;
FIGS. 5A-5E show a schematic illustration of a section through different embodiments of a polarization-influencing arrangement;
FIG. 7 shows a schematic illustration of a section through a projection exposure apparatus;
FIGS. 8A-8B shows a schematic illustration of various structures to be imaged.

DETAILED DESCRIPTION OF PREFERRED EMBODIMENTS

In association with FIGS. 8 and 9, an explanation is given below of the background reasons with respect to the imaging of structures in microlithography regarding the use of polarized illumination with respect to motivation.

A projection exposure apparatus is intended to be able to image various types of structures. FIG. 8 shows examples of such structures to be imaged. The coordinate system (x', y', z') here relates to the coordinates at the reticle, wherein y' is oriented parallel to the scanning direction. The coordinate system (x', y', z') corresponds to the coordinate system shown in FIG. 6 and FIG. 7. FIG. 8A shows one-dimensional structures to be imaged, which are arranged along a direction y' and extend parallel to the direction x'. The structure size is identified by d. FIG. 8B shows two one-dimensional structures to be imaged, which are arranged along two directions x' and y' extending perpendicularly to one another.

The use of linear polarization for the incident illumination light is advantageous for the imaging of simple line structures, as illustrated in FIG. 8A. Here the polarization direction of the light incident on the structure to be imaged during operation should advantageously be set parallel to the structure extending along the direction x'. The background reasons for this have been sufficiently known to the person skilled in the art for a long time under the keywords "vector effect".

With more complex structures, as illustrated in FIG. 8B, for example, in the pupil downstream of the diffractive structure, that is to say in the lens pupil, besides the incident illumination light, it is desirable to consider the orders of diffraction that are relevant in each case. FIG. 9A shows by way of example a pupil or part of a pupil downstream of a diffractive structure as in FIG. 8B. The coordinate system in FIG. 9 (x", y", z") correspondingly illustrates pupil coordinates. In FIG. 9A, B represents illumination light incident on the diffractive structure or the light emerging from the structure without being diffracted. The illumination light B can be diffracted in such a way that for example orders of diffraction (0,1) and (1,0) can arise downstream of, behind, the diffractive structure. The illumination light B can also be interpreted as order of diffraction (0,0). The arrows in FIG. 9A show which orders of diffraction can or are intended to interfere in each case with the illumination light B in the image field in the image plane in order to image the structures onto the wafer. (0,1) represents an order of diffraction after diffraction at a horizontal structure such as, for example, in the left-hand region of the structure illustrated in FIG. 8B. (1,0) represents an order of diffraction after diffraction at a vertical structure such as, for example, in the right-hand region of the structure illustrated in FIG. 8B.

Figure 9B:
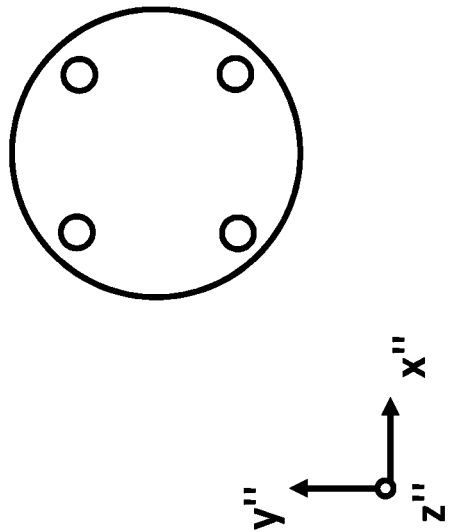
FIGS. 9A-9B shows a schematic illustration of various intensity distributions in a pupil.
Figure 9A:
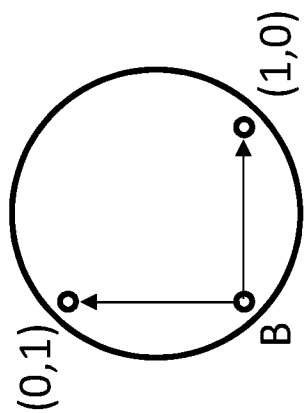

If lines having different orientations, as illustrated in FIG. 8B, for example, are intended to be imaged simultaneously using quasar illumination (as illustrated in FIG. 9B), and if all illumination directions are intended to contribute to the aerial image, then the following desired properties arise. For vertical structures, as illustrated in the right-hand region in FIG. 8B, the illumination radiation is intended to be polarized vertically, that is to say parallel to the direction y'. For horizontal structures, as illustrated in the left-hand region in FIG. 8B, the illumination radiation is intended to be polarized horizontally, that is to say parallel to the direction x'. This gives rise to conflicting desired properties in respect of the desired polarization of the illumination light B in FIG. 9A, for which reason unpolarized illumination is the most advantageous polarization state.

According to the disclosure, it has been recognized that in an EUV projection exposure apparatus, in many applications, only two polarization states have to be set:
   1.) unpolarized, or
   2.) linearly polarized along only one polarization direction. Optionally, the only one polarization direction can be variable, in particular rotatable.

The polarization-influencing arrangement according to the disclosure provides these two polarization states.

In addition, the polarization-influencing arrangement according to the disclosure affords the further advantages listed further above.

Figure 1:
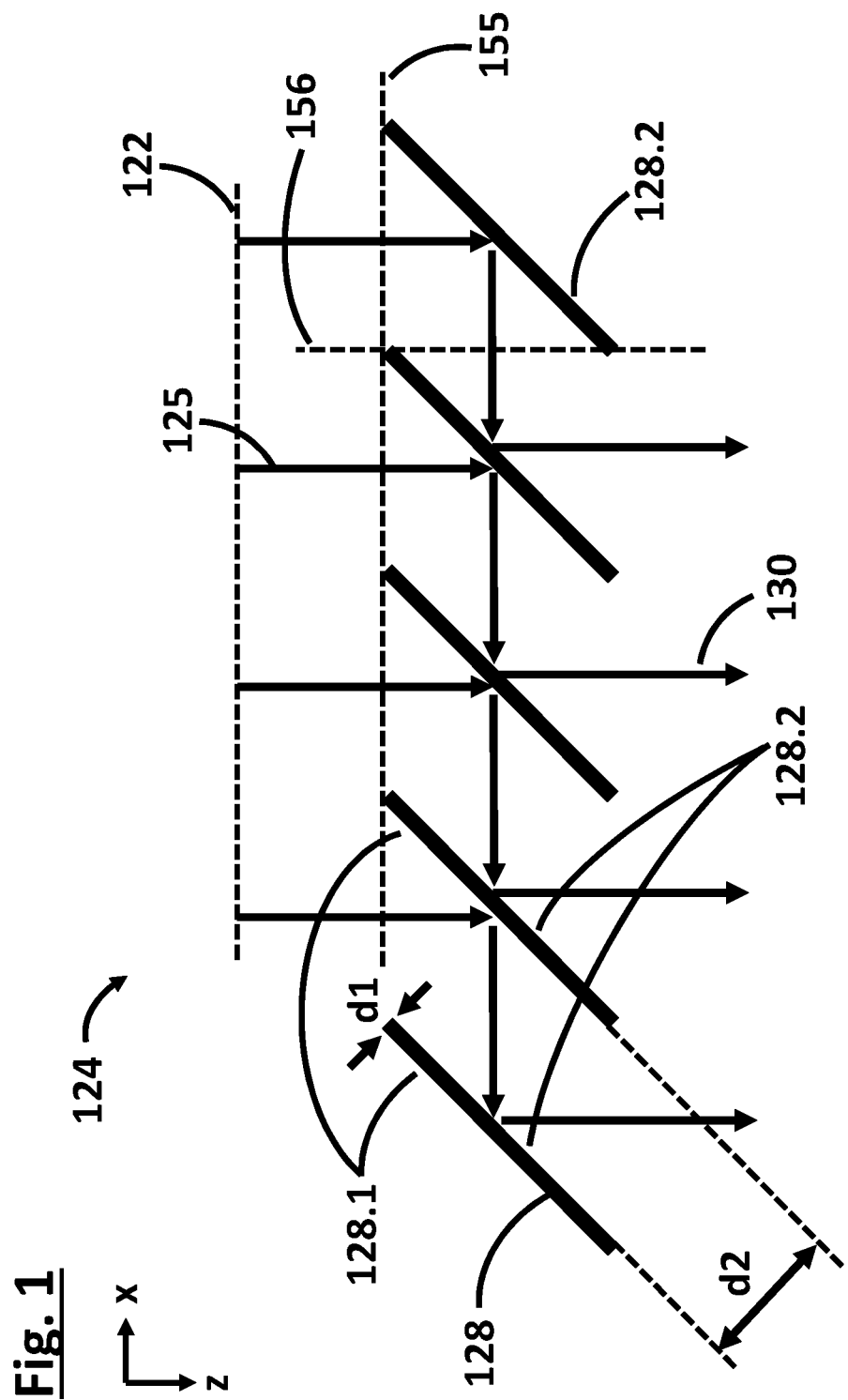
FIG. 1 shows a schematic illustration of a section through one embodiment of a polarization-influencing arrangement.

FIG. 1 shows one embodiment of a polarization-influencing arrangement 124 according to the disclosure. The polarization-influencing arrangement 124 includes a multiplicity of first reflection surfaces 128.1 and of second reflection surfaces 128.2. The first reflection surfaces 128.1 and the second reflection surfaces 128.2 are arranged in each case parallel to one another and alternately. The distances d1 and d2 between the plates as illustrated in FIG. 1 likewise alternate. In each case a first reflection surface 128.1 and a second reflection surface 128.2 are arranged close to one another at a distance d1. Such reflection surfaces arranged close to one another are referred to here as double reflection surface unit 128. In particular, it can be that d2>5*d1. As a result of the very small distance d1, possible shadings downstream, that is to say in the positive z-direction, are minimized. The surface 122 that is orthogonal to the propagation direction of the incident light 125 is illustrated in a dashed manner. The incident light is incident on the polarization-influencing arrangement 124 along the z-direction. The incident light 125 is either unpolarized or circularly polarized. Light that is unpolarized to the greatest possible extent can be generated for example by an EUV plasma source, which will be described later in association with the projection exposure apparatus. Circularly polarized light can be generated for example by specially configured free electron lasers (FELs), as described for example in U.S. Pat. No. 9,955,563 B2. The incident light 125 is incident on the first reflection surface 128.1 at approximately 43°. At EUV wavelengths almost all materials have a refractive index of approximately 1. In particular, a Brewster angle of approximately 43° can result. At the Brewster angle the polarization splitting is maximal. Polarization splitting is also referred to as diattenuation. This has the effect that the light 130 reflected at 43°±10° at the reflection surfaces 128.1 and 128.2 is polarized primarily perpendicularly to the plane of the drawing, that is to say parallel to the y-direction, wherein the y-direction is oriented perpendicularly to the directions x and z depicted. The incident light is firstly reflected at a first reflection surface 128.1 at approximately 43°±10°, i.e. the light is incident at an angle of 43°±10° on the first reflection surface 128.1, and is deflected by approximately 94°±10°, in particular by 94°±5°, in particular by 94°±1°, in particular by 94°±0.5°, toward a second reflection surface 128.2, at which the light is deflected by approximately 94°±10°, in particular by 94°±5°, in particular by 94°±1°, in particular by 94°±0.5°. The double reflection at the Brewster angle increases the polarization splitting compared with just a single such Brewster reflection. As a result of the double, oppositely directed 94° deflections, the beam direction of the doubly reflected light 130 given first and second reflection surfaces 128.1 and 128.2 arranged completely parallel remains unchanged relative to the incident light 125. This makes it possible to incorporate the polarization-influencing arrangement according to the disclosure 124 into the beam path of an existing projection exposure apparatus and even to incorporate it subsequently as a retrofittable component. The reflection surfaces 128.1 and 128.2 are arranged along the x-direction along an orientation surface 1 ("horizontal") 155 at the same height with respect to the z-direction relative to the incident light 125. In particular, here the orientation surface 1 ("horizontal") 155 is parallel to the surface 122 that is orthogonal to the propagation direction of the incident light 125. Furthermore, adjacent reflection surfaces 128.1 and 128.2 which are at a distance d2 and thus respectively belong to adjacent double reflection surface units 128 are arranged along an orientation surface 2 ("vertical") 156. This has the advantage that incident light 125 cannot pass between these two reflection surfaces 128.1 and 128.2 without double Brewster reflection, nor is there a shading region as a result of the second reflection surface 128.2 on the first reflection surface 128.1 since the two surfaces do not have an overlap region from the direction of the incident light, but rather are arranged "next to one another" in the x-direction from the viewpoint of the incident light 125.

The extent of the reflection surfaces along a direction perpendicular to the plane of the drawing, that is to say along the y-direction of the right-handed coordinate system depicted, in all embodiments shown in this application, can be greater than d2, in particular at least double the magnitude of d2, in particular at least 10 times the magnitude of d2, in particular at least 20 times the magnitude of d2.

What is thus shown is an optical system for a microlithographic projection exposure apparatus for operation in the EUV including at least one polarization-influencing arrangement 124 having at least one first and one second double reflection surface unit 128, wherein the at least two double reflection surface units each have a first reflection surface 128.1 and a second reflection surface 128.2, wherein within the same double reflection surface unit in each case the first reflection surface and the second reflection surface are arranged directly adjacent at a distance d1 and at an angle of 0°±10° relative to one another, wherein the first reflection surface of the first double reflection surface unit and the second reflection surface of the second double reflection surface unit are arranged directly adjacent at a distance d2 and at an angle of 0°±10° relative to one another, wherein light 125 incident on the first reflection surfaces during operation of the optical system forms an angle of 43°±10° with the first reflection surfaces, wherein light incident on the first reflection surface of the first double reflection surface unit during operation of the optical system is reflected toward the second reflection surface of the second double reflection surface unit, and wherein d2>5*d1 holds true.

As a result of such small distances d1, undesired shadings in the beam path downstream of the polarization-influencing arrangement are reduced. If the polarization-influencing arrangement is removed from the beam path in order to enable unpolarized operation, the light distribution in the optical system remains virtually unchanged since the undesired shadings as a result of the polarization-influencing arrangement are reduced. Moreover, removing the polarization-influencing arrangement enables unpolarized operation with a higher "transmission" since reflection surfaces can be removed from the beam path without the light distribution downstream being changed in the process. Moreover, the producibility of the polarization-influencing arrangement is simplified since the two reflection surfaces, which are only at a distance d1, are applied on a single optical element—on the front and rear sides. Production with expenditure of lower costs is achieved as a result. The "effective transmission" during polarized operation is increased by virtue of the fact that the shadings as a result of the polarization-influencing arrangement are reduced.

Figure 5B:
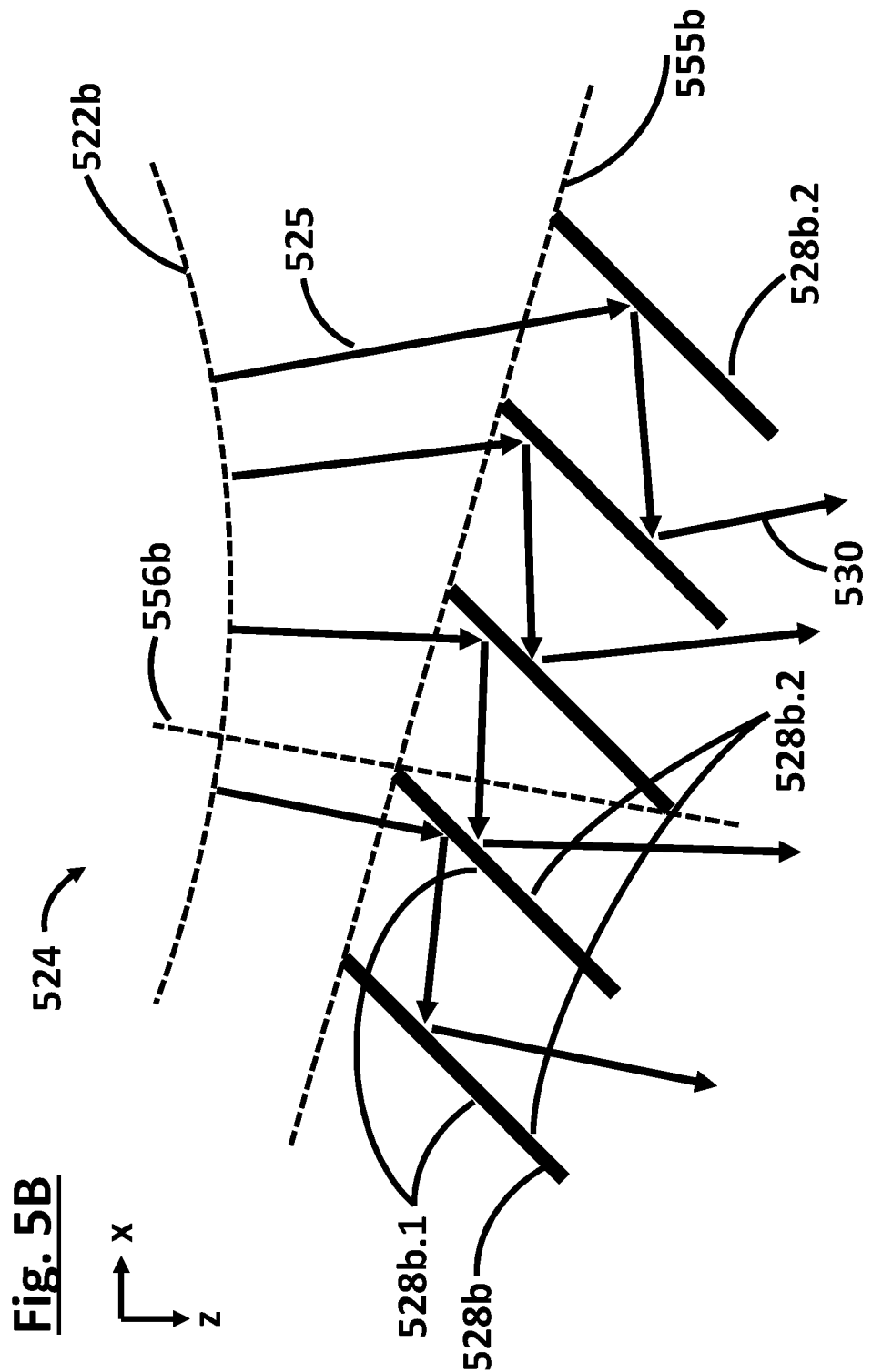
Figure 5D:
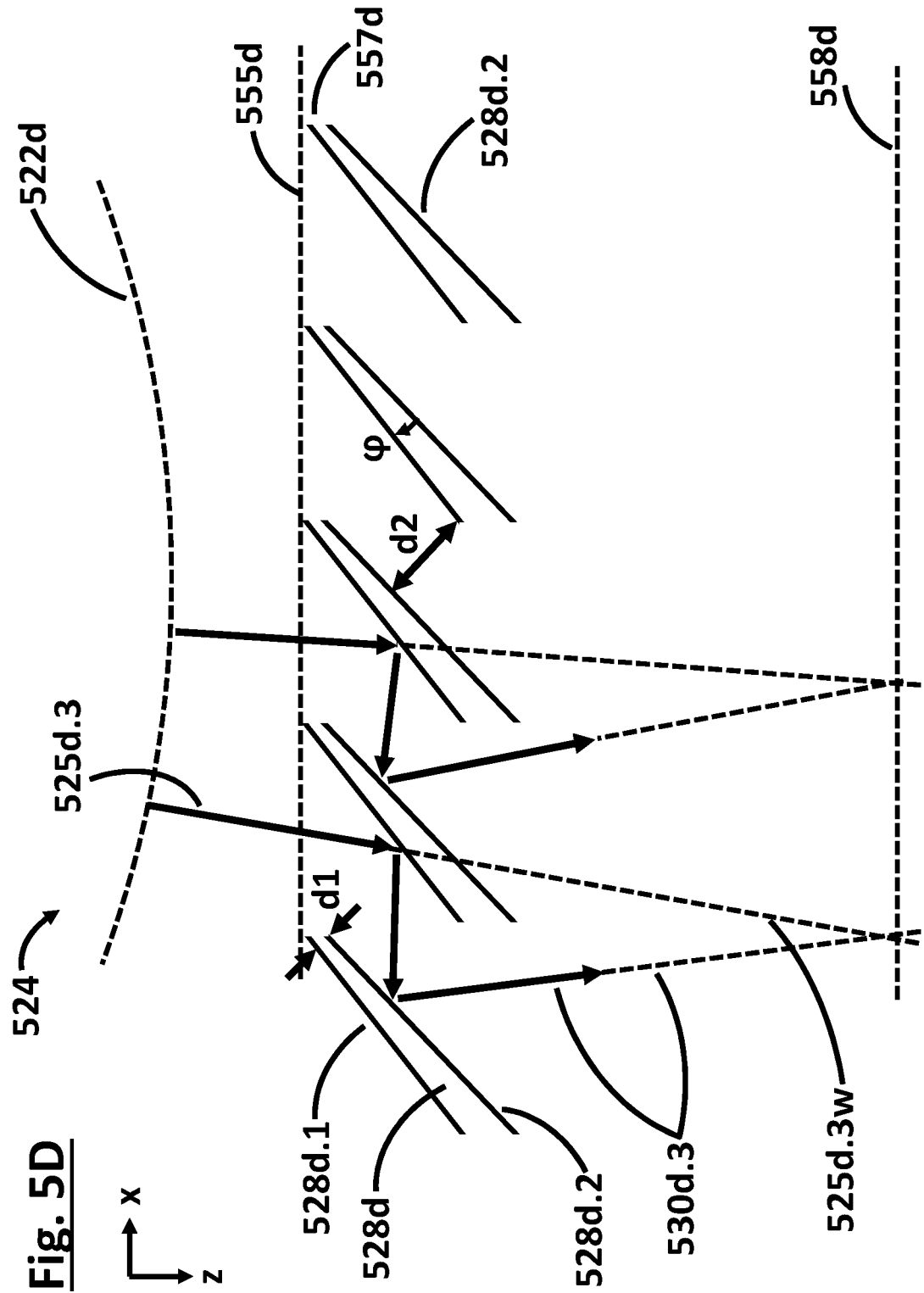
Figure 6:
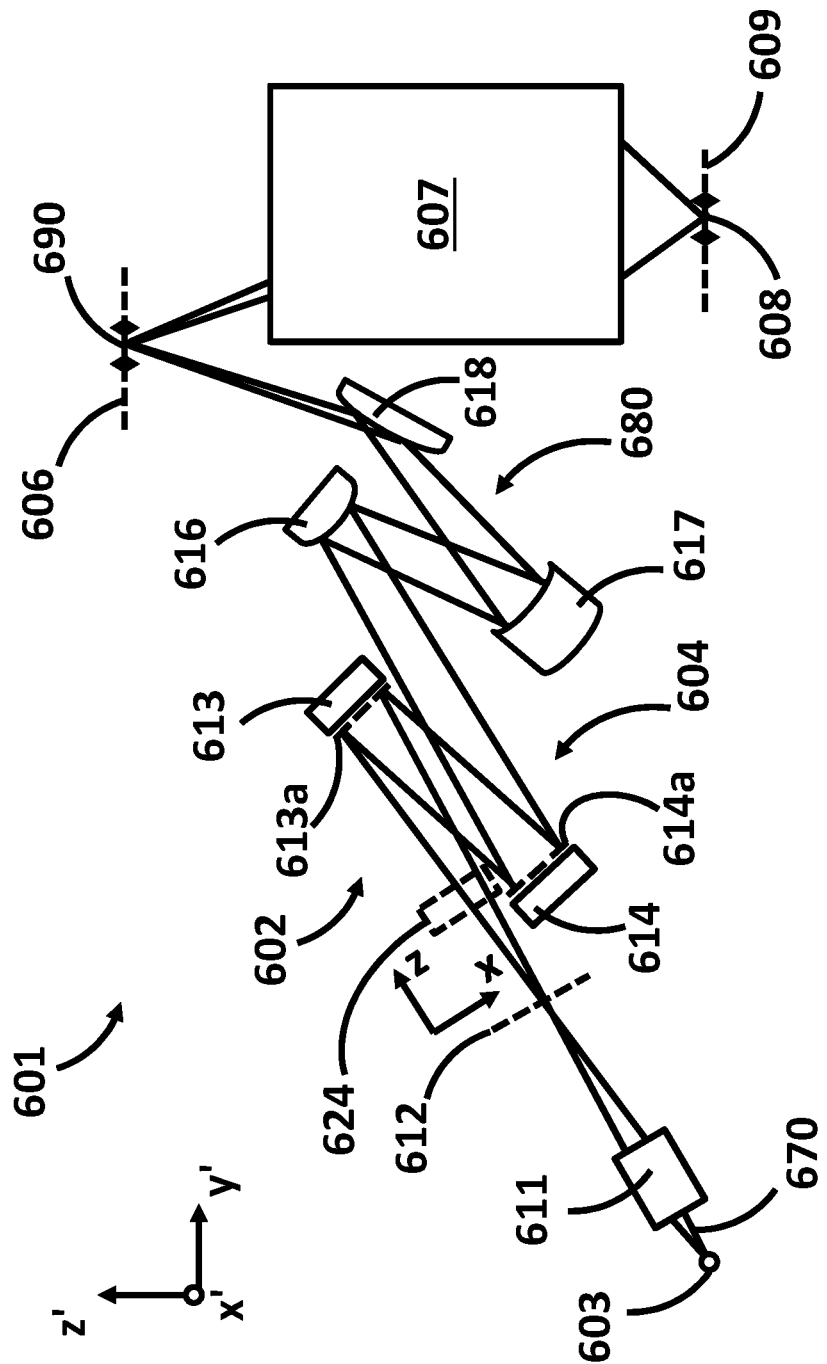
FIG. 6 shows a schematic illustration of a section through a projection exposure apparatus.

The coordinate system shown in FIGS. 1, 2, 3, 4 and 5, wherein x, y and z in each case form a right-handed coordinate system, in which the various embodiments of the polarization-influencing arrangement are shown, is depicted in FIG. 6 and FIG. 7, which respectively show projection exposure apparatuses, likewise in proximity to the polarization-influencing arrangement, such that a possible orientation of the polarization-influencing arrangement in the projection exposure apparatus is shown. The polarization-influencing arrangement can be embodied here in each case such that it is rotatable about the z-direction and/or removable from the beam path.

It is noted at this juncture that the subsequent figures each have reference signs in which the first digit respectively bears the number of the figure. The subsequent digits respectively designate similar or identical component parts illustrated in the (other) figures. By way of example, the first reflection surface 128.1 from FIG. 1 is designated as 228.1, 328.1, 428.1, . . . in the subsequent figures. For this reason, these reference signs in the further figures are deemed to have already been introduced and only the differences for the different embodiments will be discussed.

The distance d1 illustrated in FIG. 1 is extremely small. In the text which follows, the disadvantages which a larger distance d1 may have are described, in particular in association with FIG. 2, and further embodiments according to the disclosure are described in regard to how these disadvantages can be reduced or avoided, in particular in association with FIG. 3, FIG. 4A and FIG. 4B.

Figure 2:
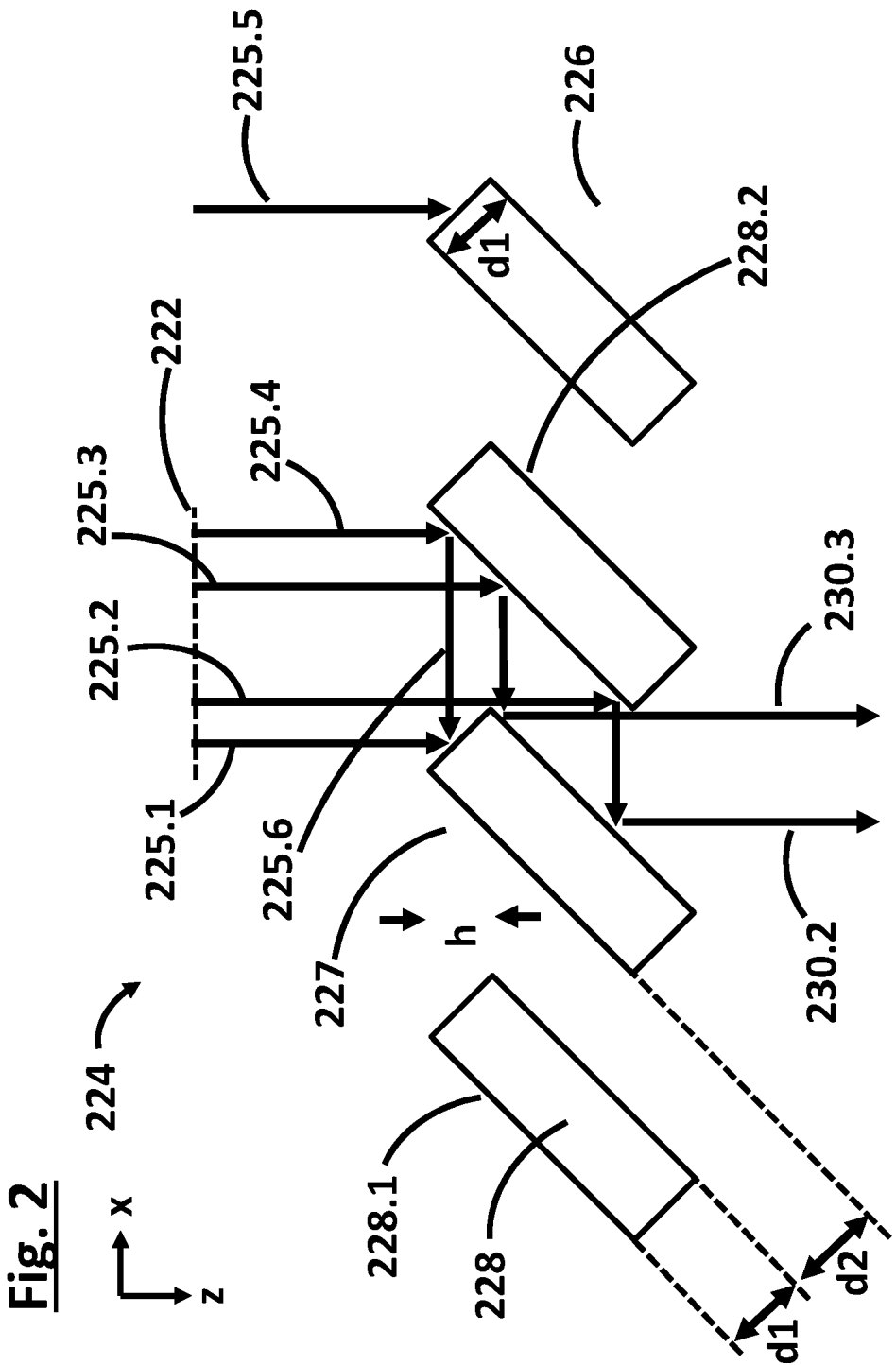
FIG. 2 shows a schematic illustration of a section through one embodiment of a polarization-influencing arrangement.

FIG. 2 shows one embodiment in which the distance d1 is chosen to be significantly larger than in the embodiment in FIG. 1. Only the incident light 225.2 and 225.3 can be guided as reflected light 230.2 and 230.3 downstream of the polarization-influencing arrangement 324 in the projection exposure apparatus toward the object plane. FIG. 2 shows for the incident light 225.4 a gray hatched shading region 227 having the width h. This shading region arises as a result of the fact that incident light 225.4 reflected at a first reflection surface 228.1 impinges on a region of an adjacently arranged double reflection surface unit 228 which does not belong to a second reflection surface 228.2, but rather is a nonreflective side surface. This firstly results in loss of light. Moreover, as a result, a shadow region arises downstream of the polarization-influencing arrangement 224, and so the illumination resulting from the reflected light 230.2, 230.3 is not uniform. Furthermore, a further shading region 226 illustrated in a hatched manner occurs as a result of the nonreflective side surface at the double reflection surface units 228. This shading results from the incident light 225.1 and 225.5 impinging directly on the nonreflective side surfaces. Consequently, a distance d1 chosen to be large can lead to large shading regions 226 and 227, resulting in extensive loss of light and extensive shadings.

FIG. 3 shows a further embodiment in which adjacent double reflection surface units 328 are arranged relative to one another in a manner displaced with respect to one another along the direction z of the incident light 325. Such an arrangement makes it possible to minimize the shading region 227 from FIG. 2. As shown in FIG. 3, on account of this displacement, the incident light 325.4 can now be reflected from the first reflection surface 328.1 toward the second reflection surface 238.2 and likewise be reflected by the latter, as a result of which this light is provided as reflected light 330.4. In the embodiment illustrated in FIG. 3, the shading region 227 from FIG. 2 does not even occur any longer.

The double reflection surface units 328 can additionally or alternatively also be arranged along orientation surfaces ("vertical") 356 in such a way that adjacent double reflection surface units 328 respectively adjoin the orientation surfaces ("vertical") 356. This has the effect that neither loss of light as a result of shadings nor a "gap" between the adjacent double reflection surface units 328 arises.

An optical system is thus shown wherein a second reflection surface 328.2 is arranged in a manner displaced by a height h relative to a directly adjacent first reflection surface 328.1 in the light propagation direction z of light 125 incident on the first reflection surface during operation of the optical system.

In accordance with one embodiment, h>d1. In particular, h deviates by at most 20% from h'=d1*√2.

The relationship between h, h' and d1 will be described in even greater detail in association with FIG. 4b.

Undesired shadings can be reduced further with these embodiments. Moreover, what can be achieved as a result is that the light distribution in the optical system changes as little as possible if the polarization-influencing arrangement is removed from the beam path or is introduced into the beam path. The "effective transmission" is increased by virtue of the fact that the shadings are reduced. From a geometric standpoint h=d1*√2 is the preferred embodiment in which the shadings in the theoretical ideal case (i.e. without tolerances, parallel incident light, etc.) completely disappear.

Figure 4A:
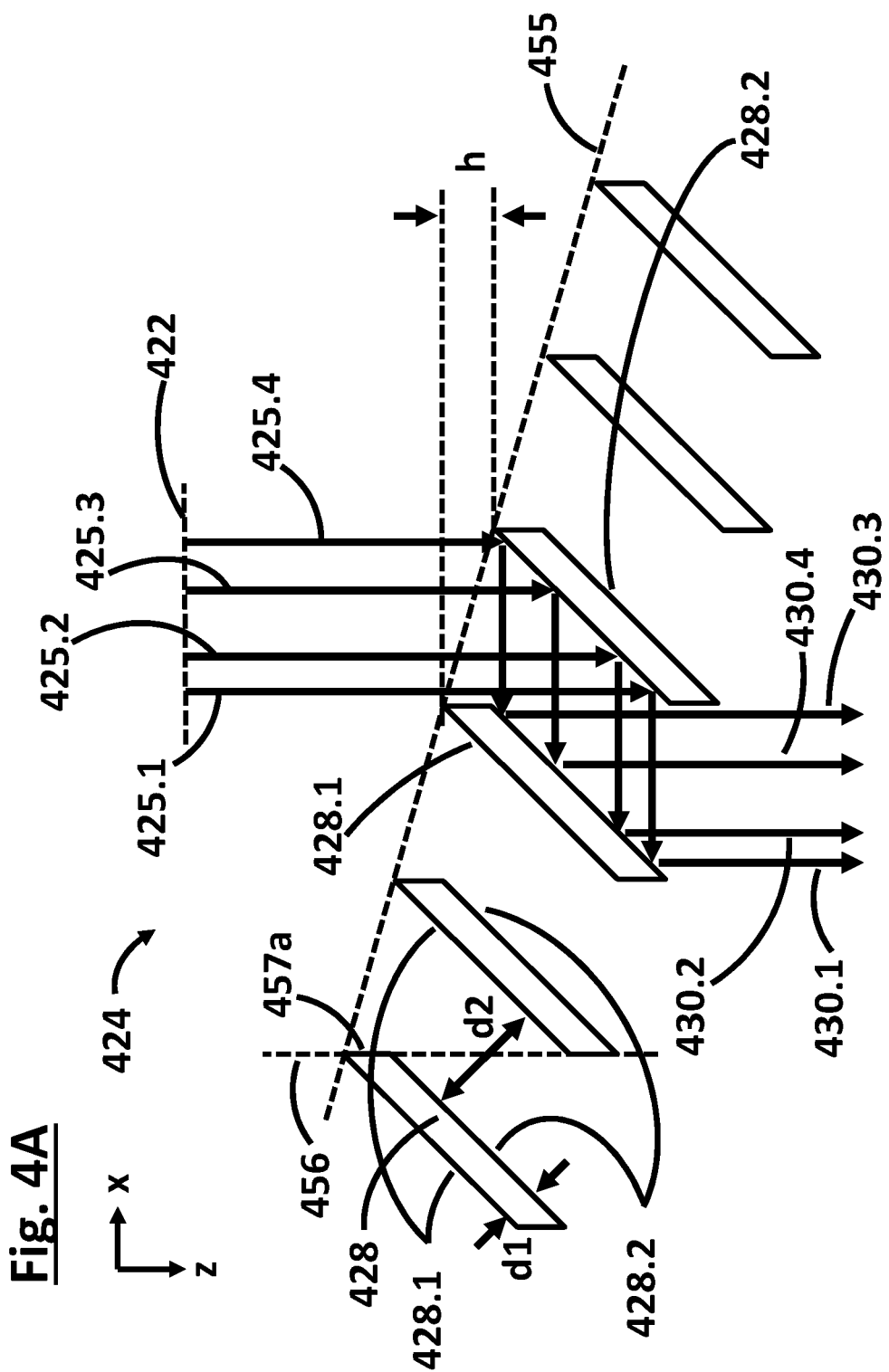
FIG. 4A shows a schematic illustration of a section through one embodiment of a polarization-influencing arrangement.

FIG. 4A shows an embodiment in which, in addition to the height displacement of the second reflection surface 428.2 by a height h relative to a directly adjacent first reflection surface 428.1 in the light propagation direction z, a nonreflective side surface 457a is also oriented parallel to a light propagation direction z of light 425 incident on the first reflection surface 428.1 during operation of the optical system. This ensures that the incident light 425.1 impinges on the first reflection surface 428.1 rather than for instance on a nonreflective side surface as shown in FIG. 2. In the embodiment in accordance with FIG. 4A there are no longer any shadings.

As a result, the undesired shadings 226 shown in FIG. 2 can be additionally reduced. Moreover, what can be achieved as a result is that the light distribution in the optical system changes as little as possible if the polarization-influencing arrangement is removed from the beam path or is introduced into the beam path. The "effective transmission" during polarized operation is increased by virtue of the fact that the shadings as a result of the polarization-influencing arrangement are reduced.

The aspects according to the disclosure
1.) height displacement of the second reflection surface 428.2 by a height h relative to a directly adjacent first reflection surface 428.1 in the light propagation direction z, as a result of which the shading region 227 in FIG. 2 is reduced; and
2.) the configuration of nonreflective side surfaces 457a parallel to the light propagation direction z, as a result of which the shading region 226 in FIG. 2 is reduced, are structurally independent of one another and can therefore, of course, also be implemented and used independently of one another. In one embodiment of the disclosure, only the nonreflective side surfaces 457a are configured parallel to the light propagation direction z, whereas the reflection surfaces not in accordance with the embodiment from FIG. 3 are arranged in a manner height-offset with respect to one another by a height h.

Figure 4B:
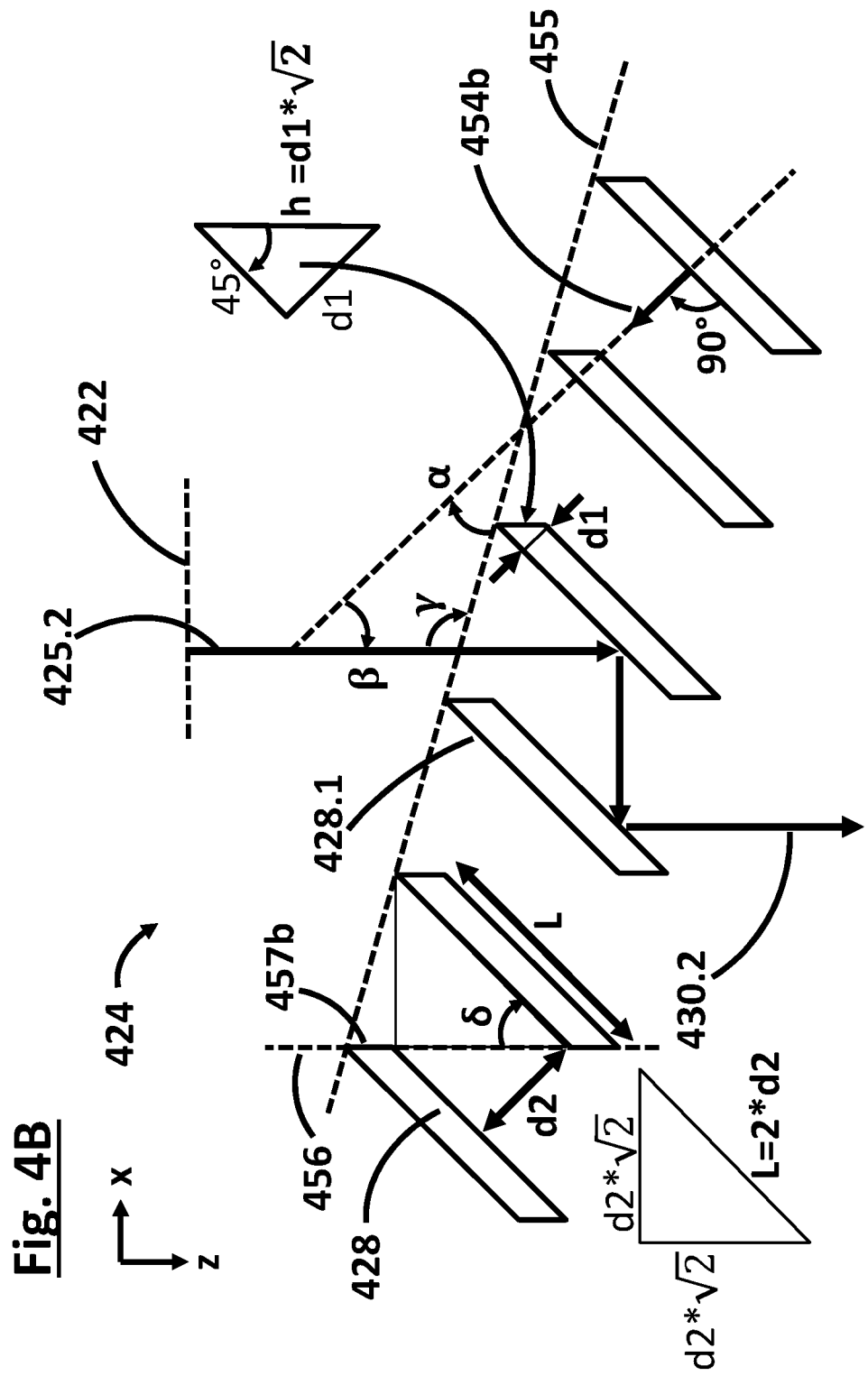
FIG. 4B illustrates geometric variables such as extents, distances and angles of the arrangement from FIG. 4A.

FIG. 4B shows the geometric relationships on the basis of the hatched triangles between the variables h and d1 and between L and d2, wherein L is the extent of the reflection surfaces 428.1 and 428.2 in a first direction of extent. In this case, the angle of incidence of the light 425 on reflection surfaces 428.1 and 428.2 is assumed to be 45° for the sake of simpler illustration. The first direction of extent is given by the projection of a light propagation direction z of light 425 incident on the first reflection surface 428.1 during operation of the optical system into a plane in which the first reflection surface 428.1 is arranged.

An optical system is thus shown including at least one reflection surface 428.1 and/or 428.2 having an extent L in a first direction of extent, wherein the first direction of extent is given by the projection of a light propagation direction z of light 425 incident on the first reflection surface 428.1 during operation of the optical system into a plane in which the first reflection surface is arranged, wherein L deviates by at most 20% from L'=2*d2. As a result, the undesired shadings can be additionally reduced. Moreover, what can be achieved as a result is that the light distribution in the optical system changes as little as possible if the polarization-influencing arrangement is removed from the beam path or is introduced into the beam path. The "effective transmission" is increased by virtue of the fact that the shadings are reduced. From a geometric standpoint L=2*d2 is the preferred embodiment in which the shadings in the theoretical ideal case (i.e. without tolerances, parallel incident light, etc.) completely disappear.

The extent of the reflection surfaces along a second direction of extent perpendicular to the plane of the drawing, that is to say along the y-direction of the right-handed coordinate system depicted, in all embodiments shown in this application, can be greater than L, in particular at least double the magnitude of L, in particular at least 10 times the magnitude of L, in particular at least 20 times the magnitude of L, in particular at least 50 times the magnitude of L, in particular at least 100 times the magnitude of L. As a result, the beam offset, which can be approximately d2*√2, that is to say approximately L/√2, as a result of the polarization-influencing arrangement, is kept small relative to the extent of the reflection surfaces along the second direction of extent along y.

FIG. 4b additionally shows the surface normal 454b to the first reflection surface 428.1, wherein the surface normal 454b forms an angle β with the incident light 425.2. This angle β can be 43°±10°. The angle between the surface normal 454b and the orientation surface 1 ("horizontal") 455 is α. The angle between the incident light 425.2 and the orientation surface 1 ("horizontal") 455 is γ. The angle between the incident light 425.2 and the first direction of extent is δ. This angle δ can be 47°±10°.

The case of parallel incident light 125, 225, 325, 425 with a planar surface 122, 222, 322, 422 is considered in FIGS. 1, 2, 3 and 4. In these cases just a slight beam offset d2*√2 parallel to the x-direction occurs as a result of the double reflection.

In FIGS. 5A, 5B, 5C and 5D, the case of divergent incident light 522a, 522b, 522c, 522d with a curved, in particular spherical, surface 522a, 522b, 522c, 522d is subsequently considered, as is the case for example for an arrangement of the polarization-influencing arrangement 524, 724 between an intermediate focal plane and a facet mirror, which will be described in greater detail further below in association with FIGS. 6 and 7. In this case, the light proceeding from an intermediate focus is incident divergently on the polarization-influencing arrangement 524.

FIG. 5A shows one embodiment of the polarization-influencing arrangement 524 which is configured structurally analogously to that in FIG. 1, but with divergent incident light 525. To a first approximation, a similar beam offset occurs again. The beam deflection as a result of the double reflections is likewise 0°, that is to say that the radiation direction is not altered.

FIG. 5B shows one embodiment of the polarization-influencing arrangement 524 in which the double reflection surface units 528*b* are arranged in a manner height-offset with respect to one another. The double reflection surface units 528*b* are arranged along an orientation surface ("horizontal") 555*b*.

The double reflection surface units 528*b* can additionally or alternatively also be arranged along orientation surfaces ("vertical") 556*b* in such a way that adjacent double reflection surface units 528*b* respectively adjoin the orientation surfaces ("vertical") 556*b*. This has the effect that neither loss of light as a result of shadings nor a "gap" between the adjacent double reflection surface units 528*b* arises.

FIG. 5E shows one embodiment in which the double reflection surface units 528*e* are arranged in a manner inclined by a small correction angle φ relative to one another. The correction angle φ is chosen in such a way that, in a plane 558*e* downstream of the polarization-influencing arrangement 524, no beam offset arises as a result of the introduction of the polarization-influencing arrangement 524 into the beam path. If the polarization-influencing arrangement 524 is not in the beam path, the incident light 525*e*.3 is incident on the plane 558*e* without reflection as light 525*e*.3*w*. If the polarization-influencing arrangement 524 is in the beam path, the incident light 525*e*.3 is incident on the plane 558*e* after the double reflection as reflected light 530*e*.3. In the plane 558*e* there is no beam offset of the two beams 525*e*.3*w* and 530*e*.3 with respect to one another. By way of example, a facet mirror 613 or 763 can be arranged in the plane 558*e* without a beam offset.

In all embodiments described in this application, both in the case of parallel and in the case of divergently incident light 125, 225, 325, 425, 525, the reflection surfaces 128.1, 228.1, 328.1, 428.1, 528.1, 128.2, 228.2, 328.2, 428.2, 528.2 can have a small correction angle φ with respect to one another, thus resulting in compensation of the beam offset as a result of the double reflections. In this case, the correction angle φ is chosen in such a way that the illuminated surface in a predefined surface downstream of the polarization-influencing arrangement 124, 224, 324, 424, 524, 624, 724, in particular on the facet mirror arranged downstream in the beam path, does not change if the polarization-influencing arrangement 124, 224, 324, 424, 524, 624, 724 is removed from the beam path or introduced into the beam path. The correction angle φ can be greater than 10°, in particular greater than 5°, in particular greater than 2°, in particular greater than 1°, in particular greater than 0.5°, in particular greater than 0.1°.

A beam offset and/or a beam tilt (in the case of divergent light) can be compensated for by a correction angle φ. The desired correction angles φ are so small that the polarizing property of the reflection remains unchanged.

FIG. 5C shows one embodiment in which the double reflection surface units 528*c* are embodied in a wedge-shaped fashion. In this case, the first reflection surface 528*c*.1 and second reflection surface 528*c*.2 of the same double reflection surface unit 528*c* are arranged at a small correction angle φ relative to one another. The correction angle φ can be less than 10°, in particular less than 5°, in particular less than 2°, in particular less than 1°, in particular less than 0.5°.

In one embodiment which can be implemented in all embodiments of the polarization-influencing arrangement 124, 224, 324, 424, 524, 624, 724 described in this application, the double reflection surface units 128, 228, 328, 428, 528*a*, 528*b*, 528*c*, 728 are embodied integrally, that is to say monolithically.

As a result, the producibility of the polarization-influencing arrangement is simplified since, instead of two separate elements, the two reflection surfaces are applied on a single optical element—on the front and rear sides. As a result, production with expenditure of lower costs is achieved since one element per double reflection surface unit can be saved.

As an alternative to a monolithic embodiment, the double reflection surface units 128, 228, 328, 428, 528*a*, 528*b*, 528*c*, 528*d*, 728 in all embodiments described in this application can also be embodied in such a way that the first reflection surface (128.1, 228.1, 328.1, 428.1, 528.1) and the second reflection surface (128.2, 228.2, 328.2, 428.2, 528.2) of a double reflection surface unit (128, 228, 328, 428, 528, 728) are arranged at different elements (528*d*). One embodiment of this type is illustrated by way of example in FIG. 5D. In this embodiment, d1 denotes the minimum distance between the two reflection surfaces. In FIG. 5D, d1 is depicted at the corresponding location of the minimum distance between the reflection surfaces. On account of the small distance d1, the shadings are reduced in the case of this embodiment as well. Moreover, the two different elements can be arranged relative to one another in such a way that a preferred arrangement of the first and second reflection surfaces—for example an exactly parallel arrangement or alternatively an arrangement inclined in a targeted manner by a correction angle φ relative to one another—is made possible. An arrangement of the first and second reflection surfaces inclined relative to one another by a correction angle φ can be used in particular for correcting the beam offset caused by the polarization-influencing arrangement. Moreover, an arrangement of the first and second reflection surfaces inclined relative to one another can be configured in such a way that the polarization-influencing arrangement is designed or optimized in a targeted manner for divergently incident light.

The structural components in all embodiments at which the first and second reflection surfaces are arranged, thus purely by way of example the abovementioned wedges 528*c*, can be mounted or held by a device which can be arranged behind and/or in front of the plane of the drawing. Such a mounting can be effected in a manner similar to that in the case of blinds in front of a window. A special embodiment of the edges, as shown in FIG. 4A, 4B or 5C, thus reduces neither the mechanical stability nor the possibility for heat dissipation.

The inventive polarization-influencing arrangement 124, 224, 324, 424, 524, 624, 724 is introduced into the beam path only if linear polarization is desired. The polarization direction can be set by rotation about an optical axis z.

The polarization-influencing arrangement 124, 224, 324, 424, 524 can be configured such that it is rotatable about a rotation axis extending parallel to a light propagation direction z of light 125, 225, 325, 425, 525 incident on the first reflection surface 128.1, 228.1, 328.1, 428.1, 528.1 during operation of the optical system, and/or can be configured such that it is removable from the beam path of the light incident on the first reflection surface during operation of the optical system.

In all embodiments, the distance d2 between the individual double reflection surface units 128, 228, 328, 428, 528, 728 can be in particular less than 30 mm, in particular less than 20 mm, in particular approximately 10 mm, in particular less than 10 mm, in particular less than 5 mm. If d2 is approximately 10 mm, that means that the introduction of the polarization-influencing arrangement, that is to say the switching-on of "polarization", displaces the illumination on the downstream facet mirror by approximately 10 mm if the reflection surfaces are arranged exactly parallel. If the diameter of a downstream facet mirror is approximately 400 mm, this beam offset is very small compared with the extent of the downstream facet mirror and in this example, in particular, amounts to just 2.5% of the diameter of the facet mirror.

In all exemplary embodiments, the first reflection surfaces 128.1, 228.1, 328.1, 428.1, 528.1 and the second reflection surfaces 128.2, 228.2, 328.2, 428.2, 528.2 can include
- an EUV reflection layer and/or
- a polarization-influencing layer and/or
- a molybdenum-silicon multilayer coating and/or
- a ruthenium coating and/or
- a molybdenum-silicon multilayer coating with a ruthenium cover layer.

The above-described embodiments of a polarization-influencing arrangement are preferably usable in the projection exposure apparatuses described below.

FIG. 6 shows a schematic section through a microlithographic projection exposure apparatus 601 known from WO 2012/130768 A2. The projection exposure apparatus 601 includes a radiation source 603 and an illumination system 602 for the exposure of an object field 690. The illumination system 602 includes a so-called fly's eye condenser including (e.g., consisting of) field facets 613a and pupil facets 614a. In this case, a reflective reticle (not illustrated in FIG. 6) arranged in the object plane 606 is exposed, the reticle bearing a structure to be projected by the projection exposure apparatus 601 for the production of microstructured or nanostructured semiconductor components, as shown for example in FIG. 8. The projection optical unit 607 serves for imaging the object field 690 into an image field 608 in an image plane 609. The structure on the reticle is imaged onto a light-sensitive layer, the so-called resist, of a wafer, which is not illustrated in the drawing and is arranged in the region of the image field 608 in the image plane 609. The reticle and the wafer are scanned in the y'-direction during the operation of the projection exposure apparatus 601. With the aid of the projection exposure apparatus 601, at least one part of the reticle is imaged onto a region of a light-sensitive layer on the wafer for the lithographic production of a microstructured or nanostructured component, in particular of a semiconductor component, for example of a microchip. Depending on the embodiment of the projection exposure apparatus 601 as a scanner or as a stepper, the reticle and the wafer are moved in a temporally synchronized manner in the y'-direction continuously in scanner operation or step by step in stepper operation. The radiation source 603 is an EUV radiation source having an emitted used radiation in the range of between 5 nm and 30 nm. This can be a plasma source, for example a GDPP (Gas Discharge Produced Plasma) source or an LPP (Laser Produced Plasma) source. Other EUV radiation sources, for example those based on a synchrotron or on a free electron laser—Free Electron Laser, FEL—are also possible. EUV radiation 670 emerging from the radiation source 603 is focused by a collector 611. Downstream of the collector 611, the EUV radiation 670 propagates through an intermediate focal plane 612 before being incident on a field facet mirror 613 with a multiplicity of field facets 613a. A polarization-influencing arrangement 624 according to the disclosure is arranged between the intermediate focal plane 612 and the field facet mirror 613. The field facet mirror 613 is arranged in a plane of the illumination optical unit 604 which is optically conjugate with respect to the object plane 606. Downstream of the field facet mirror 613, the EUV radiation 670 is reflected by a pupil facet mirror 614 with a multiplicity of pupil facets 614a. The pupil facet mirror 614 lies either near the entrance pupil plane of the projection optical unit 607 or in an optically conjugate plane with respect thereto. The field facet mirror 613 and the pupil facet mirror 614 are constructed from a multiplicity of individual mirrors. In this case, the subdivision of the field facet mirror 613 into individual mirrors can be such that each of the field facets 613a which illuminate the entire object field 690 by themselves is represented by exactly one of the individual mirrors. Alternatively, it is possible to construct at least some or all of the field facets 613a using a plurality of such individual mirrors. The same correspondingly applies to the configuration of the pupil facets 614a of the pupil facet mirror 614, which are respectively assigned to the field facets 613a and which can be formed in each case by a single individual mirror or by a plurality of such individual mirrors. The EUV radiation 670 is incident on the two facet mirrors 613, 614 at an angle of incidence that can be less than or equal to 25°, measured in relation to the normal to the mirror surface extending through the corresponding midpoints of the individual mirrors 613a and 614a, respectively. Grazing incidence is also possible, wherein the angle of incidence can be greater than or equal to 70°. With the aid of the pupil facet mirror 614, the field facets of the field facet mirror 613 are imaged into the object field 690 in a manner being superimposed on one another. Optionally, an imaging optical assembly in the form of a transfer optical unit 680 as illustrated in FIG. 6 can be present. In this case, with the aid of the pupil facet mirror 614 and the imaging optical assembly in the form of a transfer optical unit 680 having mirrors 616, 617 and 618 designated in the order of the beam path for the EUV radiation 670, the field facets of the field facet mirror 613 are imaged into the object field 690 in a manner being superimposed on one another. The last mirror 618 of the transfer optical unit 680 can be a mirror for grazing incidence—"grazing incidence mirror". The illumination light 670 is guided from the radiation source 603 toward the object field 690 via a plurality of illumination channels. Each of these illumination channels is assigned a field facet 613a of the field facet mirror 613 and a pupil facet 614a of the pupil facet mirror 614, the pupil facet being disposed downstream of the field facet. The individual mirrors 613a of the field facet mirror 613 and/or the individual mirrors 614a of the pupil facet mirror 614 can be tiltable by an actuator system, such that a change in the assignment of the pupil facets 614a to the field facets 613a and correspondingly a changed configuration of the illumination channels can be achieved. The individual mirrors of the field facet mirror 613 can be tiltable by an actuator system, such that a changed configuration of the illumination channels with a constant assignment of the pupil facets 614a to the field facets 613a can be achieved. This results in different settable illumination settings, as described in association with FIG. 9, for example, which differ in the distribution of the illumination angles of the illumination light 670 over the object field 690.

A polarization-influencing arrangement 124, 224, 324, 424, 524, 624 according to the disclosure can preferably be arranged between the intermediate focal plane 612 and the field facet mirror 613. The following advantages result from such an arrangement of the polarization-influencing arrangement:

1.) Via the polarization-influencing arrangement, de facto more than 50% of the power of the incident light is removed from the beam path (namely approximately 50% as a result of the filtered-out "incorrect" polarization direction and also additional reflection losses as a result of the double reflection). If the polarization-influencing arrangement is arranged so early in the system, the radiation loading on all downstream elements is greatly reduced, which advantageously influences effects such as the lifetime and thermal aspects.
2.) Possible shadings downstream of the polarization-influencing arrangement are "washed out" as a result of the downstream light mixing, which has a favorable influence on the uniformity of the field illumination of the reticle.

However, other arrangement regions are also possible. The polarization-influencing arrangement 124, 224, 324, 424, 524, 624 should ideally be arranged in a region which is not very near the object plane 606 since otherwise possible residual shadings may adversely influence the uniformity of the field illumination. Moreover, an arrangement in a region where divergence is not all that high is preferred, but not mandatory. In particular, the polarization-influencing arrangement 124, 224, 324, 424, 524, 624 could also be arranged between the radiation source 603 and the intermediate focal plane 612, which makes possible the same advantages discussed above as an arrangement between the intermediate focal plane 612 and the field facet mirror 613. In particular, the polarization-influencing arrangement 124, 224, 324, 424, 524, 624 could also be arranged between the field facet mirror 613 and the pupil facet mirror 614. In particular, the polarization-influencing arrangement 124, 224, 324, 424, 524, 624 could also be arranged downstream of the pupil facet mirror 614.

In accordance with one embodiment, the projection exposure apparatus 601 includes an illumination system 602 including an optical system including at least one polarization-influencing arrangement 124, 224, 324, 424, 524, 624 having at least one first and one second double reflection surface unit 128, 228, 328, 428, 528, 728. The at least two double reflection surface units each have a first reflection surface 128.1, 228.1, 328.1, 428.1, 528.1 and a second reflection surface 128.2, 228.2, 328.2, 428.2, 528.2. Within the same double reflection surface unit, in each case the first reflection surface and the second reflection surface are arranged directly adjacent at a distance d1 and at an angle of 0°±10° relative to one another. The first reflection surface of the first double reflection surface unit and the second reflection surface of the second double reflection surface unit are arranged directly adjacent at a distance d2 and at an angle of 0°±10° relative to one another. During operation of the optical system, light 125, 225, 325, 425, 525 incident on the first reflection surfaces forms an angle of 43°±10° with the first reflection surfaces. During operation of the optical system, light incident on the first reflection surface of the first double reflection surface unit is reflected toward the second reflection surface of the second double reflection surface unit. For the distances d1 and d2 it holds true that d2>5*d1.

As a result of such small distances d1, undesired shadings in the beam path downstream of the polarization-influencing arrangement are reduced. If the polarization-influencing arrangement is removed from the beam path in order to enable unpolarized operation, the light distribution in the optical system remains virtually unchanged since the undesired shadings as a result of the polarization-influencing arrangement are reduced. Moreover, removing the polarization-influencing arrangement enables unpolarized operation with a higher "transmission" since reflection surfaces are removed from the beam path without the light distribution being changed in the process. Moreover, the producibility of the polarization-influencing arrangement is simplified since the two reflection surfaces, which are only at a distance d1, are applied on a single optical element—on the front and rear sides. Production with expenditure of lower costs is achieved as a result. The "effective transmission" during polarized operation is increased by virtue of the fact that the shadings as a result of the polarization-influencing arrangement are reduced.

FIG. 7 shows a projection exposure apparatus 701 known from US 2011/0001947 A1 including an alternative illumination optical unit of an illumination system 702. EUV radiation 770 emerging from the radiation source 703 is focused by a collector 711. Downstream of the collector 711, the EUV radiation 770 propagates through an intermediate focal plane 712 before being incident on a beam-shaping facet mirror 763 serving for the targeted illumination of a specular reflector 764. A polarization-influencing arrangement 724 according to the disclosure including double reflection surface units 728 is arranged between the intermediate focal plane 712 and the facet mirror 763. Via the beam-shaping facet mirror 763 and the specular reflector 764, the EUV radiation 770 is shaped such that the EUV radiation 770 illuminates the object field 790 in the object plane 706, wherein in a pupil plane 765—disposed downstream of the reticle—of the projection optical unit, not illustrated in FIG. 7, a predefined illuminated, circularly bounded pupil illumination distribution, as shown in FIG. 9, for example, that is to say a corresponding illumination setting, results. The effect of the specular reflector 764 is described in detail in US 2006/0132747 A1. A reflection surface of the specular reflector 764 is subdivided into individual mirrors. Depending on the desired illumination properties, these individual mirrors of the specular reflector 764 are grouped to form individual mirror groups, that is to say to form facets of the specular reflector 764. Each individual mirror forms an illumination channel, which in each case by itself does not completely illuminate the reticle field. Only the sum of all the illumination channels results in a complete and homogeneous illumination of the reticle field. The individual mirrors of the specular reflector 764 and/or the facets of the beam-shaping facet mirror 763 can be tiltable by an actuator system, such that different field and pupil illuminations are settable.

A polarization-influencing arrangement 124, 224, 324, 424, 524, 724 according to the disclosure can preferably be arranged between the intermediate focal plane 712 and the facet mirror 763. The following advantages result from such an arrangement of the polarization-influencing arrangement:
1.) Via the polarization-influencing arrangement, de facto more than 50% of the power of the incident light is removed from the beam path (namely approximately 50% as a result of the filtered-out "incorrect" polarization direction and also additional reflection losses as a result of the double reflection). If the polarization-influencing arrangement is arranged so early in the system, the radiation loading on all downstream elements is greatly reduced, which advantageously influences effects such as the lifetime and thermal aspects.
2.) Possible shadings downstream of the polarization-influencing arrangement are "washed out" as a result of the downstream light mixing, which has a favorable influence on the uniformity of the field illumination of the reticle.

However, other arrangement regions are also possible. The polarization-influencing arrangement 124, 224, 324, 424, 524, 724 should ideally be arranged in a region which is not very near the object plane 706 since otherwise possible residual shadings may adversely influence the uniformity of the field illumination. Moreover, an arrangement in a region where divergence is not all that high is preferred, but not mandatory. In particular, the polarization-influencing arrangement 124, 224, 324, 424, 524, 724 could also be arranged between the radiation source 703 and the intermediate focal plane 712, which makes possible the same advantages discussed above as an arrangement between the intermediate focal plane 712 and the facet mirror 763. In particular, the polarization-influencing arrangement 124, 224, 324, 424, 524, 724 could also be arranged between the facet mirror 763 and the specular reflector 764. In particular, the polarization-influencing arrangement 124, 224, 324, 424, 524, 724 could also be arranged downstream of the specular reflector 764. In particular, the polarization-influencing arrangement 124, 224, 324, 424, 524, 724 could also be arranged between the specular reflector 764 and the object field 790.

In accordance with one embodiment, the projection exposure apparatus 701 includes an illumination system 702 including an optical system including at least one polarization-influencing arrangement 124, 224, 324, 424, 524, 624 having at least one first and one second double reflection surface unit 128, 228, 328, 428, 528, 728. The at least two double reflection surface units each have a first reflection surface 128.1, 228.1, 328.1, 428.1, 528.1 and a second reflection surface 128.2, 228.2, 328.2, 428.2, 528.2. Within the same double reflection surface unit, in each case the first reflection surface and the second reflection surface are arranged directly adjacent at a distance d1 and at an angle of 0°±10° relative to one another. The first reflection surface of the first double reflection surface unit and the second reflection surface of the second double reflection surface unit are arranged directly adjacent at a distance d2 and at an angle of 0°±10° relative to one another. During operation of the optical system, light 125, 225, 325, 425, 525 incident on the first reflection surfaces forms an angle of 43°±10° with the first reflection surfaces. During operation of the optical system, light incident on the first reflection surface of the first double reflection surface unit is reflected toward the second reflection surface of the second double reflection surface unit. For the distances d1 and d2 it holds true that d2>5*d1.

As a result of such small distances d1, undesired shadings in the beam path downstream of the polarization-influencing arrangement are reduced. If the polarization-influencing arrangement is removed from the beam path in order to enable unpolarized operation, the light distribution in the optical system remains virtually unchanged since the undesired shadings as a result of the polarization-influencing arrangement are reduced. Moreover, removing the polarization-influencing arrangement enables unpolarized operation with a higher "transmission" since reflection surfaces are removed from the beam path without the light distribution being changed in the process. Moreover, the producibility of the polarization-influencing arrangement is simplified since the two reflection surfaces, which are only at a distance d1, are applied on a single optical element—on the front and rear sides. Production with expenditure of lower costs is achieved as a result. The "effective transmission" during polarized operation is increased by virtue of the fact that the shadings as a result of the polarization-influencing arrangement are reduced.

In all the embodiments described above, the polarization-influencing arrangement is configured such that it is retrofittable in existing projection exposure apparatuses, without the need for fundamental changes to the existing projection exposure apparatuses.

LIST OF REFERENCE SIGNS 122, 222, 322, 422, 522 surface orthogonal to the light propagation direction
124, 224, 324, 424, 524, 624, 724 polarization-influencing arrangement
125, 225, 325, 425, 525 incident light
128, 228, 328, 428, 528, 728 double reflection surface unit
128.1, 228.1, 328.1, 428.1, 528.1 first reflection surface
128.2, 228.2, 328.2, 428.2, 528.2 second reflection surface
130, 230, 330, 430, 530 reflected light
531$c$.3$w$, 531$e$.3$w$ beam path without pol.-influen. arrangement
155, 355, 455, 555 orientation surface 1 ("horizontal")
156, 356, 456, 556 orientation surface 2 ("vertical")
558$c$, 558$e$ plane without beam offset
226, 227 shading region
454$b$ surface normal
457$a$, 457$b$, 557$c$ side surface parallel to the light propagation direction
601, 701 projection exposure apparatus
602, 702 illumination system
603, 703 radiation source
604 illumination optical unit
606, 706 object plane
607 projection optical unit
608 image field
609, 709 image plane
611, 711 collector
612, 712 intermediate focal plane
613 field facet mirror
613$a$ field facets
614 pupil facet mirror
614$a$ pupil facets
616, 617, 618 mirror of the transfer optical unit
670, 770 EUV radiation
680 transfer optical unit
690, 790 object field
763 beam-shaping facet mirror
764 specular reflector
765 pupil plane
α angle between surface normal and orientation surface 1
β angle between surface normal and incident light
γ angle between incident light and orientation surface 1
δ angle between 1st direction of extent and incident light
φ correction angle
d1 distance between reflection surfaces
d2 distance between reflection surfaces
L extent of reflection surfaces

What is claimed is:

1. An optical system, comprising:
a polarization-influencing arrangement comprising first and second double reflection surface units,
wherein:
the first double reflection surface unit comprises first and second reflection surfaces which reflect light at a wavelength;
the second double reflection surface unit comprises first and second reflection surfaces which reflect light at the wavelength;

within each of the first and second double reflection surface units, the first and second reflection surfaces are directly adjacent at a distance d1 and at an angle of 0°±10° relative to one another;

the first reflection surface of the first double reflection surface unit and the second reflection surface of the second double reflection surface unit are directly adjacent at a distance d2 and at an angle of 0°±10° relative to one another;

during operation of the optical system, light at the wavelength incident on the first reflection surfaces defines an angle of 43°±10° with the first reflection surface; and during operation of the optical system, light at the wavelength incident on the first reflection surface of the first double reflection surface unit is reflected toward the second reflection surface of the second double reflection surface unit;

the first double reflection surface unit does not transmit light at the wavelength;

the second double reflection surface unit does not transmit light at the wavelength; and d2>5*d1.

2. The optical system of claim 1, wherein the polarization-influencing arrangement comprises at least ten double reflection surface units.

3. The optical system of claim 2, wherein the first reflection surfaces and the second reflection surfaces of the double reflection surface units are arranged alternately and at alternate distances d1 and d2.

4. The optical system of claim 1, wherein the polarization-influencing arrangement is rotatable about a rotation axis extending parallel to a propagation direction of the light at the wavelength incident on the first reflection surfaces during operation of the optical system.

5. The optical system of claim 4, wherein the polarization-influencing arrangement is removable from the beam path of the light at the wavelength incident on the first reflection surfaces during operation of the optical system.

6. The optical system of claim 1, wherein the polarization-influencing arrangement is removable from a beam path of the light at the wavelength incident on the first reflection surfaces during operation of the optical system.

7. The optical system of claim 1, wherein, for at least one double reflection surface unit selected from the group consisting of the first double reflection surface unit and the second double reflection surface unit, the first and second reflection surfaces are surfaces of a monolithic element.

8. The optical system as claimed in claim 7, wherein a nonreflective side surface of the monolithic element is arranged parallel to a propagation direction of light at the wavelength incident on the first reflection surface during operation of the optical system.

9. The optical system of claim 1, wherein, for at least one double reflection surface unit selected from the group consisting of the first double reflection surface unit and the second double reflection surface unit, the first and second reflection surfaces are arranged at different elements.

10. The optical system of claim 1, wherein, for at least one double reflection surface unit selected from the group consisting of the first double reflection surface unit and the second double reflection surface unit, the first and second reflection surfaces comprise at least one member selected from the group consisting of an EUV reflection layer, a polarization-influencing layer, a molybdenum-silicon multilayer coating, a ruthenium coating, and a molybdenum-silicon multilayer coating with a ruthenium cover layer.

11. The optical system of claim 1, wherein:

in a propagation direction of light at the wavelength incident on the first reflection surfaces during operation of the optical system, a second reflection surface is displaced by a distance h relative to a directly adjacent first reflection surface; and h>d1.

12. The optical system of claim 11, wherein h deviates by at most 20% from the distance d1 multiplied by $\sqrt{2}$.

13. The optical system of claim 1, wherein:

a reflection surface has an extent L in a first direction which is given by a propagation direction of light at the wavelength incident on the first reflection surface during operation of the optical system into a plane in which the first reflection surface is arranged; and L deviates by at most 20% from twice the distance d2.

14. The optical system of claim 1, wherein:

the first and second double reflection surface units are inclined relative to each other by an angle φ, or a first reflection surface and a second reflection surface are inclined relative to each other by the angle φ; and the angle φ is greater than 0.1°.

15. The optical system of claim 1, wherein the polarization-influencing arrangement is configured so that during operation of the optical system the polarization-influencing arrangement converts unpolarized or circularly polarized light at the wavelength incident on the first reflection surface into linearly polarized light at the wavelength reflected from the second reflection surface.

16. An illumination system, comprising:

an optical system according to claim 1, wherein the illumination system is a microlithographic projection exposure apparatus illumination system.

17. The illumination system of claim 16, further comprising a facet mirror, wherein the polarization-influencing arrangement is in a beam path between the facet mirror and an intermediate focal plane of the illumination system.

18. An apparatus, comprising:

an illumination system comprising the optical system of claim 1; and a projection optical unit, wherein the apparatus is a microlithographic projection exposure apparatus.

19. A method of using a microlithographic projection exposure apparatus comprising an illumination system and a projection optical unit, the method comprising:

using the illumination system to illuminate structures of a mask; and using the projection optical unit to project at least part of the illumination structures onto a light-sensitive material, wherein the illumination system comprises an optical system according to claim 1.

20. The optical system of claim 1, wherein the wavelength is an EUV wavelength.

* * * * *